(12) United States Patent
McKee et al.

(10) Patent No.: US 6,211,684 B1
(45) Date of Patent: *Apr. 3, 2001

(54) INTERNAL UNBALANCE DETECTION IN CAPACITORS

(75) Inventors: Gregg L. McKee, Rancho Santa Fe; Frederick W. MacDougall, San Diego, both of CA (US)

(73) Assignee: General Atomics, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/340,612

(22) Filed: Jun. 28, 1999

Related U.S. Application Data

(63) Continuation-in-part of application No. 09/222,589, filed on Dec. 28, 1998, now Pat. No. 6,107,808.

(51) Int. Cl.[7] .................... G01R 31/12; H01H 31/02; H02H 9/02; H01G 5/00; G08B 21/00
(52) U.S. Cl. .................... 324/548; 324/537; 361/93.1; 361/287; 340/664
(58) Field of Search .................... 324/548, 537; 361/93.1, 277, 287, 281; 340/664

(56) References Cited

U.S. PATENT DOCUMENTS

| | | | |
|---|---|---|---|
| 2,576,432 | 11/1951 | Marbury | 175/294 |
| 2,704,341 | 3/1955 | Stacy et al. | 317/256 F |
| 2,896,049 | 7/1959 | Maier | 200/113 |
| 3,080,506 | 3/1963 | Minder | 317/12 |
| 3,125,720 | 3/1964 | Swift | 324/51 |
| 3,141,995 | 7/1964 | Smith | 317/12 |
| 3,512,149 | 5/1970 | Pugh | 340/253 |
| 3,735,250 | 5/1973 | Masui | 324/51 |
| 3,755,711 | 8/1973 | Fendt | 317/12 B |
| 3,816,800 | 6/1974 | Ringler et al. | 317/12 A |
| 3,973,169 | 8/1976 | Titus | 317/12 B |
| 4,104,687 | 8/1978 | Zulaski | 361/17 |
| 4,114,089 | 9/1978 | Ahmed | 324/509 |
| 4,219,856 | 8/1980 | Danfors et al. | 361/15 |
| 4,285,022 | * 8/1981 | Lewiner et al. | 361/93.1 |
| 4,713,604 | 12/1987 | Becker et al. | 324/500 |
| 4,805,063 | 2/1989 | Kataoka et al. | 361/16 |
| 4,956,739 | 9/1990 | Becker et al. | 361/16 |
| 4,998,098 | 3/1991 | Schweitzer, III | 324/551 |
| 5,008,586 | * 4/1991 | Miyazaki et al. | 361/93.1 |
| 5,506,743 | 4/1996 | Phillips | 361/85 |

* cited by examiner

Primary Examiner—Safet Metjahic
Assistant Examiner—Jermele M. Hollington
(74) Attorney, Agent, or Firm—Fitch, Even, Tabin & Flannery

(57) ABSTRACT

A capacitor is made up of a housing; a first plurality of capacitors within the housing; a second plurality of capacitors within the housing; a first electrode coupled to a first terminal, with the first terminal being electrically contactable outside the housing; a second electrode coupled to a second terminal, with the second terminal being contactable outside the housing; a threshold circuit that compares performance of the first plurality of capacitors with performance of the second plurality of capacitors, detects an unbalance, and generates an output signal; and a signal output coupled to the threshold circuit, the signal output being accessible outside the housing. A method of operating a capacitor has steps of coupling a first electrode of the capacitor to a system; coupling a second electrode of the capacitor to a system; applying a voltage across the first and second electrodes; detecting an unbalance within the capacitor; determining whether a degree of such unbalance is greater than a first threshold and less than a second threshold; signaling the detected unbalance in the event the degree of such unbalance is greater than a first threshold and less than a second threshold; determining whether the degree of such unbalance is greater than the second threshold; and initiating a shutdown of the capacitor in the event the degree of such unbalance if greater than the second threshold.

34 Claims, 13 Drawing Sheets

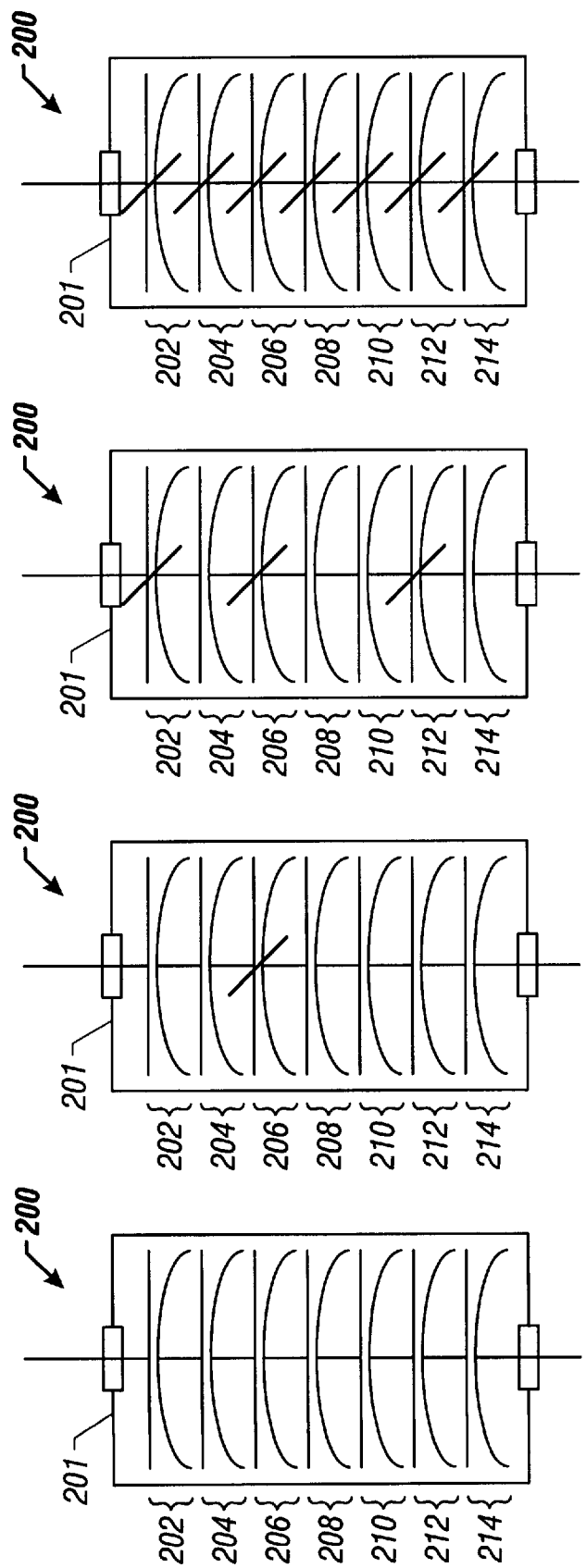

INTERNAL UNBALANCE DETECTION IN CAPACITORS

This application is a continuation-in-part (CIP) of U.S. Ser. No. 09/222,589, filed Dec. 28, 1998 now U.S. Pat. No. 6,107,808, for INTERNAL UNBALANCE DETECTION IN CAPACITORS, which is incorporated herein by reference.

BACKGROUND OF THE INVENTION

The present invention relates to internal unbalance detection in capacitors using circuitry internal to the capacitor, and more particularly to the pre-detection of capacitor section failures within a capacitor. Even more particularly, the present invention relates to the detection of capacitor section failures within a capacitor using internal circuitry and, for example, a fiber optic output, wherein capacitor failure is detected upon, for example, a detected failure of a prescribed number of capacitor sections and capacitor failure is pre-detected, i.e., incipient capacitor failure is detected upon, for example, a detected failure of a predetermined lesser number of capacitor sections. Even more particularly the present invention also relates to detection of incipient capacitor failure with a widely varying voltage on the capacitor, without the need to recalibrate the detection system to account for the widely varying voltage.

Present day operational equipment and research devices require the use of large capacitors connected in banks, and in some instances employ capacitor sections connected in commonly-housed capacitors. As used herein the term capacitor section refers to a single capacitor element, e.g., in general, a pair of conductive structures, e.g., plates, separated by a dielectric material. The term capacitor refers to a functional electrical component made up of at least one capacitor section, and having at least two externally accessible electrodes through electrical connection can be made to the one or more capacitor sections. The term capacitor module refers to that portion of, for example, a high voltage device, such as an accelerator or a laser, made up of at least one capacitor, and associated hardware. By high voltage it is meant a device operating at, for example, more than 5 kilovolts, e.g., 10 kilovolts.

Standard practice for high voltage capacitors dictates that each capacitor consists of several parallel series of high voltage capacitor sections in a sealed casing (or housing).

A short circuit (which is a typical failure mode for high voltage capacitor sections in high voltage capacitors) in one or more of the high voltage capacitor sections may result in a rapid increase in heat in the capacitor and may result in an explosion and ensuing fire. Since the capacitors are made of series-connected capacitor sections and because each capacitor section in the series may be operating below its maximum voltage rating, e.g., at 80% of its maximum voltage rating, damage as a result of a short circuit in one high voltage capacitor section may be temporarily held off by other capacitor sections in the series (because they will operate closer to their maximum voltage rating, but not exceed their maximum voltage rating).

As a result, it is typically difficult to even determine if a short circuit in an individual high voltage capacitor section within the sealed housing of the capacitor has occurred, before a catastrophic failure occurs. The same situation occurs for capacitors made up of capacitor sections that fail in an open circuit mode utilizing self-clearing electrodes or internal fuses. Once a single high voltage capacitor section within the capacitor fails, however, a subsequent failure of another high voltage capacitor section within the capacitor may result in remaining capacitor sections operating at or above their maximum voltage ratings. At this point one can expect the remaining high voltage capacitor sections to fail rather quickly, resulting in failure of the capacitor. Thus, while it is important that a short circuit in an individual high voltage capacitor section in a capacitor be detected and corrected as soon as possible, before explosion or fire, to prevent damage to equipment or injury to personnel, no satisfactory means of such detection is commercially available.

One prior art approach to detecting faulty capacitor sections within capacitors is to monitor liquid dielectric pressure within the capacitors. Because the liquid dielectric pressure changes abruptly, due, for example, to gas generation or when the temperature inside the capacitor rises abruptly due, for example, to a short circuit, measuring the liquid dielectric pressure provides an indication that a short circuit has occurred. Specifically, when a high voltage capacitor section fails, the high voltage capacitor section typically has a short arcing between its plates causing a build up of heat and/or gas, and in turn, a build up of pressure in the liquid dielectric, which can be measured at a pressure valve. Typically an interlock mechanism is then used to remove the capacitor from service, thus shutting down whatever system is being used with the capacitor.

Advantageously, this type of detection does not require any external electrical connections, which can pose a significant problem when capacitors are themselves series connected or operating at high voltages. (This problem arises because while any electrical outputs from short-detecting circuitry may only be a few volts in the capacitor, the voltage above "earth ground" can be on the order of several kilovolts or more.)

Unfortunately, liquid dielectric pressure detection requires long periods for detection due to a significant time required to build up sufficient heat and pressure within the liquid dielectric to result in a detection since the system must be able to handle normally expected changes in temperature due to changes in the ambient operating temperature or the internal temperature rise due to operating conditions. Thus, the time required to detect a capacitor failure by the so-called pressure method often results in explosion because of the destruction of other elements due to over-stresses leading to a short circuit in the over-stressed sections. And, even when a capacitor failure is detected, such detection is generally considered a detection of imminent failure, and thus an interlock mechanism or the like must be used to take the capacitor offline, thus shutting down whatever equipment is being used with the capacitor. Also, the pressure interrupters sometimes yield a false signal due to changes in pressure inside the capacitor associated with operating of conditions other than failure. These "unscheduled" shutdowns can be quite costly in, for example, experimental accelerators, as valuable experiments can be spoiled and valuable accelerator time lost.

An alternative approach involves monitoring voltage across each individual capacitor section within the capacitor. An example of this approach is highlighted in U.S. Pat. No. 3,125,720 (Swift) and in U.S. Pat. No. 4,805,063 (Kataoka, et al.). Each of these patents describes one or more approaches for detecting a failure by monitoring voltage across a voltage divider set in parallel with the series connected capacitor sections within the capacitor. Both of these patents, however, describe approaches that are unsuitable in extremely high voltage environments due to the requirement of electrical connections between the individual capacitor sections inside the housing of the capacitor to external unbalance detection circuits outside the housing of the capacitor, through the housing of the capacitor. As mentioned above, these electrical connections, in practice, can be of significant voltage potentials above earth ground, posing an extreme risk of arcing and risking damage to sensitive monitoring and experimentation hardware.

As pointed out above, another problem encountered in applications with which high voltage capacitors are used is that such applications require that the capacitors remain online continuously and not be unexpectedly switched out of service, such as, for example, in the event of an interlock mechanism switching the capacitor out of service upon detection of a capacitor failure. Examples of these types of systems include experimental accelerators used for the refinement of nuclear fuel, such as at Los Alamos National Laboratories, wherein a shutdown as a result of capacitor failure can result in spoiling very expensive experiments, and loss of precious accelerator time. Accordingly, prior art systems such as used in power line applications, that automatically switch capacitors out of operation using an interlock mechanism when over-voltages are detected, or that remove capacitors from operation, such as through series fuses when short-circuits are detected, are expensive and often unacceptable in many real-world applications in which high voltage capacitors are employed.

Thus, what is needed is an unbalance detection approach in which early detection (or pre-detection) of incipient capacitor failure can be made, without shutdown of the capacitor, unless a catastrophic failure, such as an explosion, of the capacitor is imminent. In this latter case, it would remain important to switch the capacitor off using, for example, an interlock mechanism, such as is known in the prior art, and for that matter switch remaining power circuits off, so as to prevent catastrophic failure, fires, and the like. However, it is also very desirable and preferable to allow capacitors with early-detected minor failures to continue to operate until repair can be scheduled and effected without interrupting valuable operations and experimentation.

The present invention advantageously addresses the above and other needs.

SUMMARY OF THE INVENTION

The present invention advantageously addresses the needs above as well as other needs by providing a method and apparatus for internal unbalance detection in capacitors.

One embodiment of the present invention can be characterized as a capacitor having a housing; a first plurality of capacitor sections in a first series within the housing; a second plurality of capacitor sections in a second series within the housing; a first electrode coupled to a first terminal of the first series, and to a first terminal of the second series, with the first terminal being electrically contactable outside the housing; a second electrode coupled to a second terminal of the first series, and to a second terminal of the second series, the second terminal being contactable outside the housing; a threshold circuit that compares performance of the first series with performance of the second series, detects an unbalance in the first series and the second series, and generates an output signal in response thereto, the output signal varying as a function of whether the unbalance is detected; and a signal output coupled to the threshold circuit, the signal output being accessible outside the housing.

Another embodiment of the present invention can be characterized as a capacitor having a housing; a first electrode contactable from outside the housing, a second electrode contactable from outside the housing, and an unbalance detection output contactable from outside the housing, wherein an unbalance detection signal indicative of a degree of unbalance is present at the unbalance detection output.

Yet another embodiment of the present invention can be characterized as a method of operating a capacitor. The method has steps of coupling a first electrode of the capacitor to a system; coupling a second electrode of the capacitor to the system; applying a voltage across the first and second electrodes; detecting an unbalance within the capacitor; determining whether a degree of such unbalance is greater than a first threshold and less than a second threshold; signaling the detected unbalance in the event the degree of such unbalance is greater than a first threshold and less than a second threshold; and determining whether the degree of such unbalance is greater than the second threshold; and initiating a shutdown of the capacitor in the event the degree of such unbalance is greater than the second threshold.

A further embodiment of the invention further comprises: a housing; a first plurality of capacitor sections in a first series within the housing; a second plurality of capacitor sections in a second series within the housing; a first electrode coupled to a first terminal of the first series, and a first terminal of the second series, the first electrode being electrically contactable outside the housing; a second electrode coupled to a second terminal of the first series, and a second terminal of the second series, the second electrode being contactable outside the housing; means for measuring a reference voltage that represents a voltage applied across the capacitor; means for comparing performance of the first series with performance of the second series, for detecting an unbalance in the first series and the second series, and for generating signals in response thereto, varying with the unbalance; a comparison circuit for receiving the signal, coupled to the means for comparing and to the means for measuring the reference voltage, for comparing the unbalance to the reference voltage; and a signal output coupled to the means for comparing, receiving the signals and transmitting a resultant signal to the comparison circuit.

BRIEF DESCRIPTION OF THE DRAWINGS

The above and other aspects, features and advantages of the present invention will be more apparent from the following more particular description thereof, presented in conjunction with the following drawings wherein:

FIGS. 2A, 2B, 2C and 2D are a schematic diagram illustrating a progressive short circuit failure sequence, in a capacitor such as the capacitor of FIG. 1;

Figure 17:
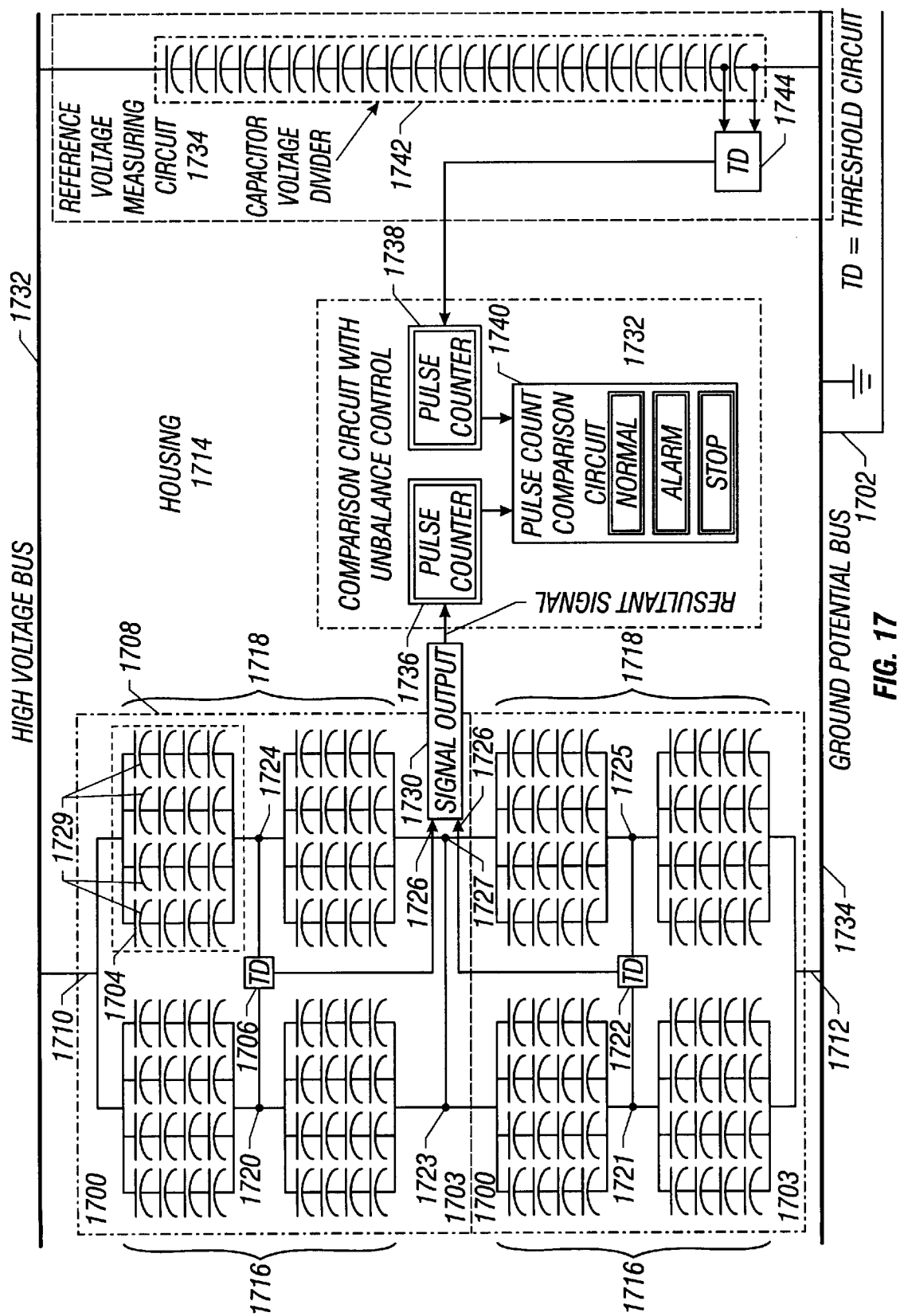
FIG. 17 is a schematic diagram of one variation of the capacitor of FIG. 1, with a capacitor control system, having multiple respective threshold circuits measuring multiple capacitor sections in multiple capacitor units such as shown by FIG. 5., and having a high voltage bus as a power input and multiple threshold circuit such as the threshold circuit shown by FIG. 16, and having a capacitor voltage divider as a reference voltage measuring circuit.
Figure 18:
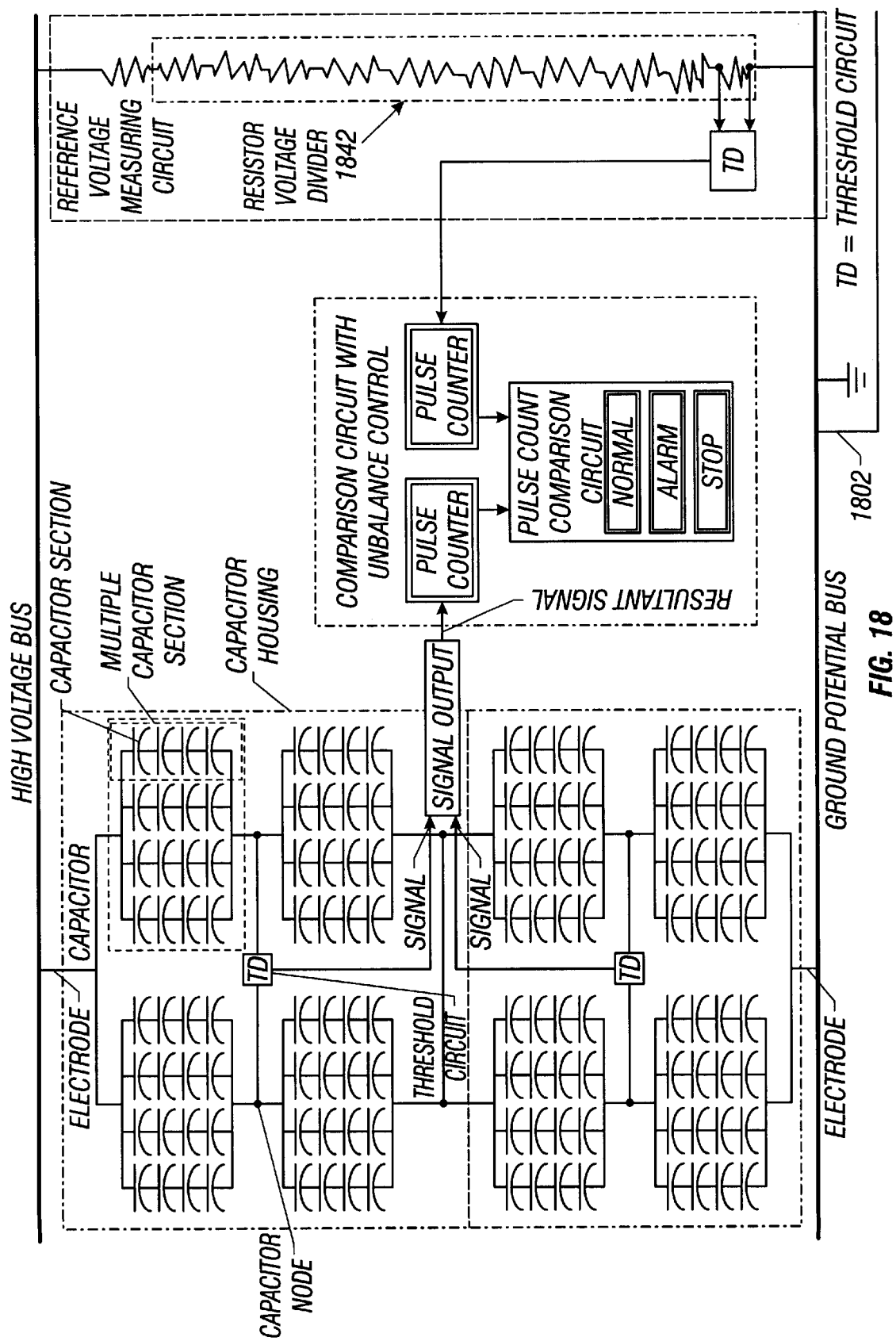
FIG. 18 is a schematic diagram of another variation of the capacitor of FIG. 1, and analogous capacitor control system to the system of FIG. 17, having multiple respective threshold circuits measuring multiple capacitor sections in multiple capacitor units such as shown by FIG. 5., having a high voltage bus as a power input and multiple threshold circuits such as the threshold circuit shown by FIG. 16, and a capacitor voltage divider as a reference voltage measuring circuit.

APPENDIX is an appendix of supplemental descriptive material relative to embodiments of the system of FIG. 17 and 18.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
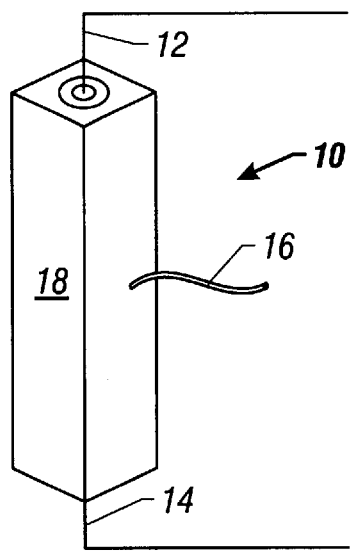
FIG. 1 is a perspective view of an exemplary capacitor in accordance with an embodiment of the present invention.

Referring first to FIG. 1, a perspective view is shown of an exemplary capacitor 10 in accordance with an embodiment of the present invention. Shown is typical of an example of a large high voltage double ended capacitor 10 having a first electrode 12 and a second electrode 14. (By high voltage it is meant a capacitor capable of operating a voltage of, for example, 5 kilovolts or more, e.g., 10 kilovolts.) Also shown is an output port 16 through which a fiberoptic cable connection is passed through a housing 18, such as a plastic insulated housing, in order to provide an unbalance detection output.

Advantageously, in accordance with the present embodiment, the unbalance detection output signals at least three possible conditions: balanced; unbalanced with predetection of capacitor failure; and unbalanced with detection of imminent capacitor failure. Thus, unlike in prior art approaches, the capacitor 10 of the present embodiment can be taken offline and replaced during a scheduled maintenance operation when predetection of capacitor failure is signaled as opposed to merely taken offline immediately upon the detection of an imminent capacitor failure. At the same time, should the capacitor 10 fail more quickly than expected, i.e., before scheduled maintenance can be performed, an interlock mechanism, such as is known in the prior art, can be used upon the signaling of imminent capacitor failure to remove the capacitor 10 from service, as well as shut down related systems, before catastrophic failure of the capacitor 10 occurs.

Further advantageously, by providing the unbalance detection output through a fiberoptic cable connection, the potentially hazardous use of external electrical connections, which may be many kilovolts above earth ground, is avoided. In other words, the capacitor 10 provides an unbalance detection scheme in which there are no exposed live parts (NELP). Alternatively, however, voltage isolation, such as is known in the art, may be used to provide a low voltage electrical conductor at the unbalance detection output. Or, acoustic coupling, such as an acoustic waveguide, can be used to communicate the unbalance detection output from unbalance detection hardware within the capacitor to circuits outside the capacitor. Further, in alternative embodiments, an sound generator may be located entirely within the capacitor, with external circuits "listening" for a particular audible signal emitted from the capacitor. In this latter variation, monitoring may be carried out entirely manually by an operator who is alerted by audio signals emanating from a capacitor in which an unbalance has been detected.

Also advantageously, the capacitor 10 performs unbalance detection internally, providing the unbalance detection output as an indication of capacitor unbalance, as opposed to requiring multiple external connections and external unbalance detection hardware. This heretofore unavailable structure provides a great deal of simplicity and increased safety not available in prior art approaches, along with the increased functionality of predetection of capacitor failure, and heightened safety and ease of design that accompany the use of the fiberoptic 16 cable as a connector for the unbalance detection output.

Referring next to FIG. 2A, 2B, 2C and 2D, shown is a schematic diagram illustrating a failure sequence in a capacitor 200, such as the capacitor 10 of FIG. 1. A rupture of a capacitor casing 201 (or housing), particularly an oil-filled capacitor casing, can cause collateral damage far more costly than the failure of the capacitor itself.

All capacitor sections and thus capacitors, eventually reach the end of their lives. In FIGS. 2A, 2B, 2C and 2D, each of the capacitors 200 shown represents an internal series group of high voltage capacitor sections 202, 204, 206, 208, 210, 212, 214. In FIG. 2A, none of the high-voltage capacitor sections is shorted. When one of the capacitor sections 206 shorts, which is a typical failure mode for the capacitor sections 202, 204, 206, 208, 210, 212, 214 within the capacitor 200, the capacitor 200 can be represented such as shown in FIG. 2B. This type of failure would be typical of the start of a failure of the capacitor 200. Following initial failure, the number of shorted capacitor sections 202, 204, 206, 208, 210, 212, 214 normally progresses to a point where about half of the capacitor sections 204, 206, 212 are shorted, such as is shown in FIG. 2C. Once about half of the capacitor sections 202, 204, 206, 208, 210, 212, 214 are shorted, the remaining capacitor sections 204, 208 210, 214 tend to short out simultaneously due to the very high voltage stresses placed on these remaining capacitor sections 204, 208, 210, 214. A completely shorted capacitor 200 is shown in FIG. 2D. Advantageously, the present embodiment allows the detection of capacitor section failures, such as in FIG. 2B, well before complete capacitor failure, such as in FIG. 2D, occurs or is imminent. Thus, protective actions and scheduled maintenance can occur well before capacitor failure.

Figure 3:
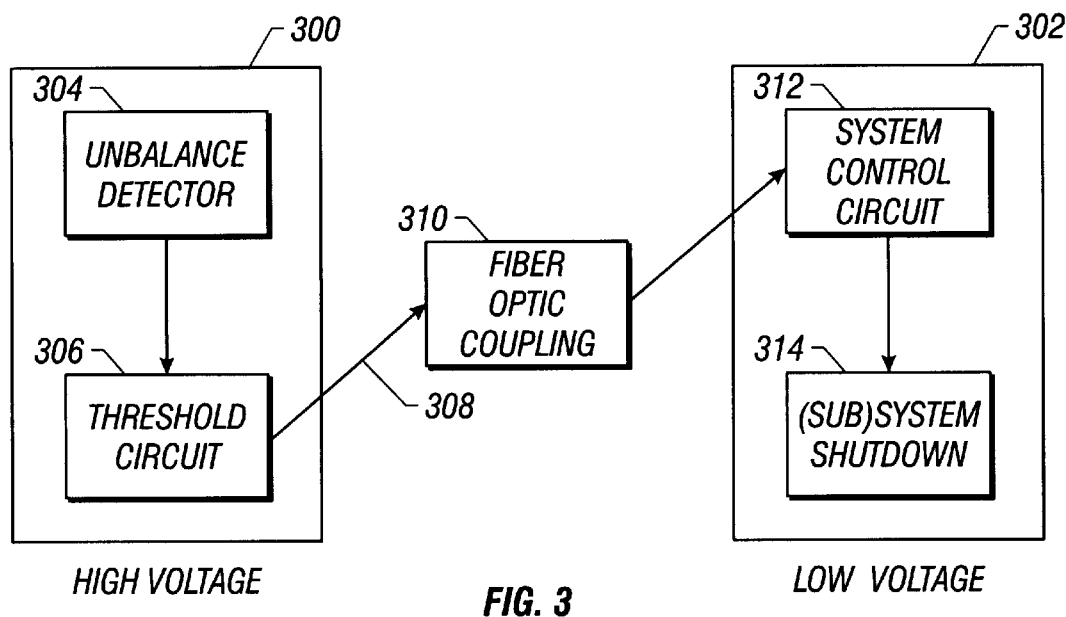
FIG. 3 is a block diagram illustrating a capacitor, such as in FIG. 1, in combination with a control unit that signals a capacitor unbalance and, in extreme cases, initiates a shutdown of the capacitor, such as by activating an interlock mechanism, in order to avoid catastrophic capacitor and/or system failure.

Referring next to FIG. 3, shown is a block diagram illustrating a capacitor 300 such as in FIG. 1, in combination with a control unit 302 that signals an unbalance detection and, in extreme cases, initiates a shut down of the capacitor 300 in order to avoid catastrophic failure.

Shown is the capacitor 300 in accordance with the present embodiment, including an unbalance detector 304 and a threshold circuit 306. Also present are a plurality of parallel-connected capacitor sections in series (not shown). An output 308 of the threshold circuit 306, which is typically in the form of a fiberoptic cable or feed, such as is shown in FIG. 1, passes through a fiberoptic coupling 310 to the control unit 302. The control unit 302 consists of a system control circuit 312, which interprets the unbalance detection output from the threshold circuit 306, signaling either that system maintenance is needed, i.e., a predetected capacitor failure, or in extreme cases, signaling an imminent capacitor failure. In the event a predetection occurs, the system control circuit 312 signals the need to replace the capacitor 300 by, for example, generating a predetection signal causing illuminating a light on a control panel (not shown) and/or the sounding of an audible alarm. In the event detection of an imminent capacitor failure occurs, the system control circuit 312 signals the need to take the capacitor offline by, for example, generating a shut down signal, which is passed to a system shutdown circuit 314, such as an interlock circuit such as are known in the art. When extreme unbalance is detected, the system control circuit 312 signals the system shutdown circuit 314, which in turn initiates shutdown of the capacitor 300 and possibly shutdown of the system with which the capacitor 300 is employed.

As shown, the unbalance detector 304 and the threshold circuit 306 are integrated into the capacitor 300 within its housing or casing, and thus are part of the capacitor 300. The casing may preferably have a non-conductive surface, such as in a plastic insulated case. In the event that any one or more capacitor sections of the capacitor 300 shorts out, the unbalance detection signal is generated by the threshold circuit 306 indicative of the unbalance itself, and its degree.

Figure 4:
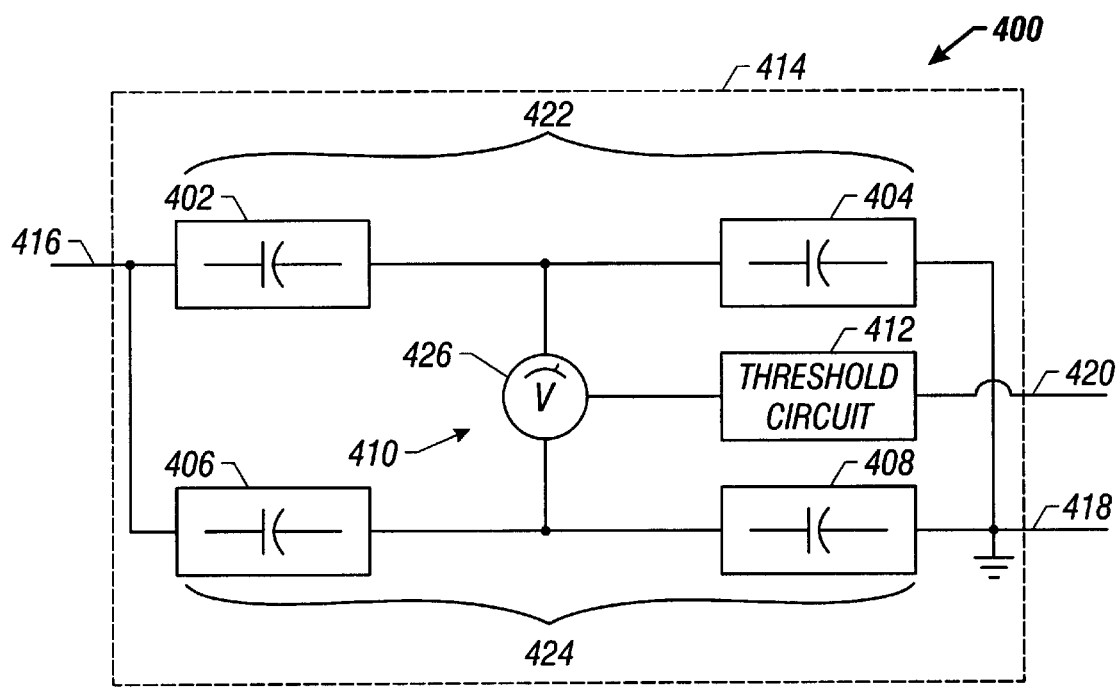
FIG. 4 is a block diagram of a capacitor such as shown in FIG. 1, with a plurality of individual capacitor sections and a voltage differential unbalance detection circuit.

Referring next to FIG. 4, shown is a block diagram of a capacitor 400 such as shown in FIG. 1, showing, by way of example, a plurality of individual capacitor sections in series 402, 404, 406, 408, a voltage unbalance detection circuit 410, and a threshold circuit 412. The capacitor 400 is enclosed within a housing 414 or casing 414 indicated with a dashed line, with the capacitor electrodes 416, 418 and the unbalance detection output 420 being shown extending from within the housing 414 to outside the housing 414. Advantageously, in accordance with the present embodiment, the capacitor electrodes 416, 418 and the unbalance detection output represent the only signal connections needed from within the capacitor housing to outside the capacitor's housing.

Within the capacitor 400, the capacitor electrodes 416, 418 are connected each to two parallel current paths 422, 424. Each current path 422, 424 is made up of a first capacitor section series 402, 406 in series with a node and a second capacitor section series 404, 408. A voltage detector 426, is interposed between the node in the first current path 422 and the node in the second current path 424 in order to measure a voltage between the nodes of the two parallel current paths 422, 424. The voltage detector 426 provides an output to the threshold circuit 412, which generates the unbalance detection signal at the unbalance detection output 420 as a function of the voltage indicated by the voltage detector 426, 428. For example, the threshold detector may signal an unbalance when the voltage measured is more than a threshold amount. The unbalance detection output 420 is provided to the outside world. Preferably, this unbalance detection output 420 is carried on a fiberoptic conductor or cable, as opposed to an electric conductor or cable so that high voltage isolation results. Advantageously, the only three outputs of the capacitor 400 that pass through the capacitor housing 514, are the two capacitor electrodes 416, 420 and the unbalance detection output 420, thereby providing a complete self-contained capacitor capable of providing a measure of unbalance detection to a control unit, such as in FIG. 2.

Figure 5:
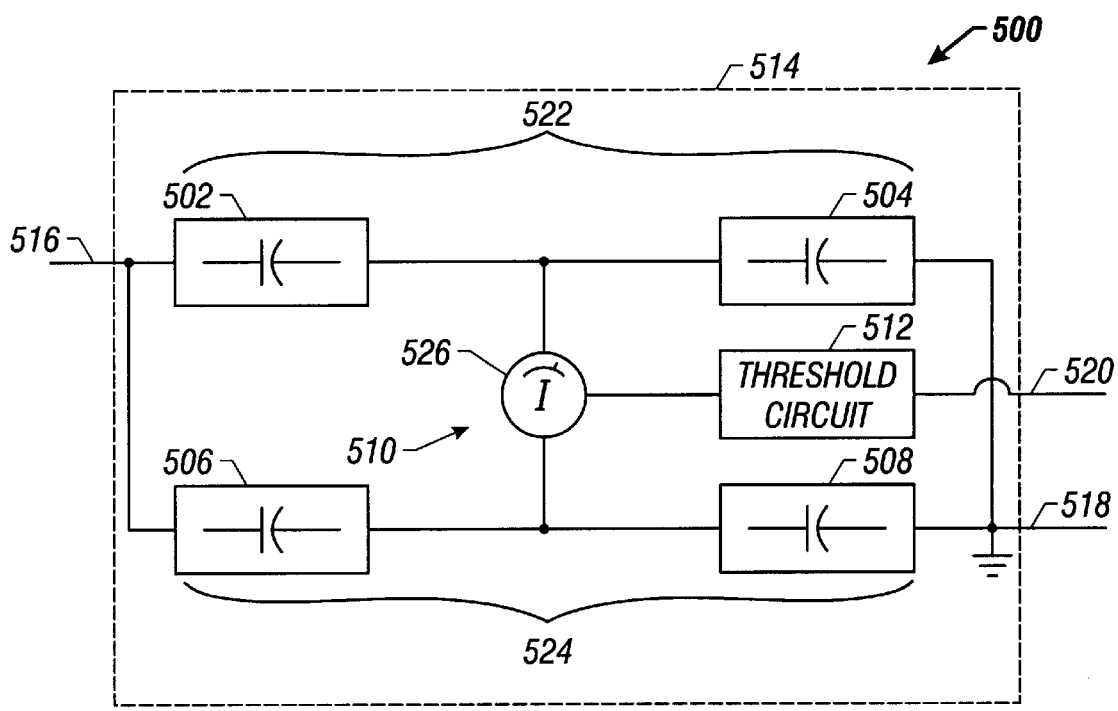
FIG. 5 is a block diagram of an alternative capacitor, such as shown in FIG. 1, with a plurality of individual capacitor sections and a current differential unbalance detection circuit.

Referring next to FIG. 5, shown is a block diagram of a capacitor 500, such as shown in FIG. 1, with a plurality of individual capacitor sections in series 502, 504, 506, 508 a current unbalance detection circuit 410 and a threshold circuit 512. The capacitor 500 is enclosed within the housing 514 or casing 514, represented with a dashed line from which each of the capacitor electrodes 516, 518 extend along with the unbalance detection output. Within the capacitor 500, each of the capacitor electrodes 516, 518 is connected to a current path 522, 524 consisting of a first of the capacitor sections in series 502, 506 in series with a node in series with a second of the capacitor sections in series in 504, 508. A current detectors 526 interposed between the node in the first current path 522 and the node in the second current path 524 in order to measure current flowing between the nodes of the current paths 522, 524. The current detector 526 is coupled to the threshold circuit 512, which compares the current flowing between the nodes of each of the current paths 522, 524. The threshold circuit 512 generates an unbalance detection output as a function of the difference between current flowing between the nodes of each of the current paths 522, 524. For example, when an unbalance occurs between the capacitor sections in the current paths 522, 524, current will flow between the nodes. When this current is more than a threshold amount, the threshold circuit, for example, indicates an unbalance in an unbalance detection signal at the unbalance detection output 510. As with the embodiment of FIG. 4, the unbalance detection output 520 is preferably in the form of a fiberoptic conductor, thereby providing voltage isolation and increasing safety. As can be seen, the only three outputs of the capacitor 500 that pass through the capacitor housing 514, are the two capacitor electrodes 516, 518 and the unbalance detection output 520, thereby providing a complete self-contained capacitor capable of providing a measure of unbalance detection to a control unit, such as shown in FIG. 2.

Figure 6:
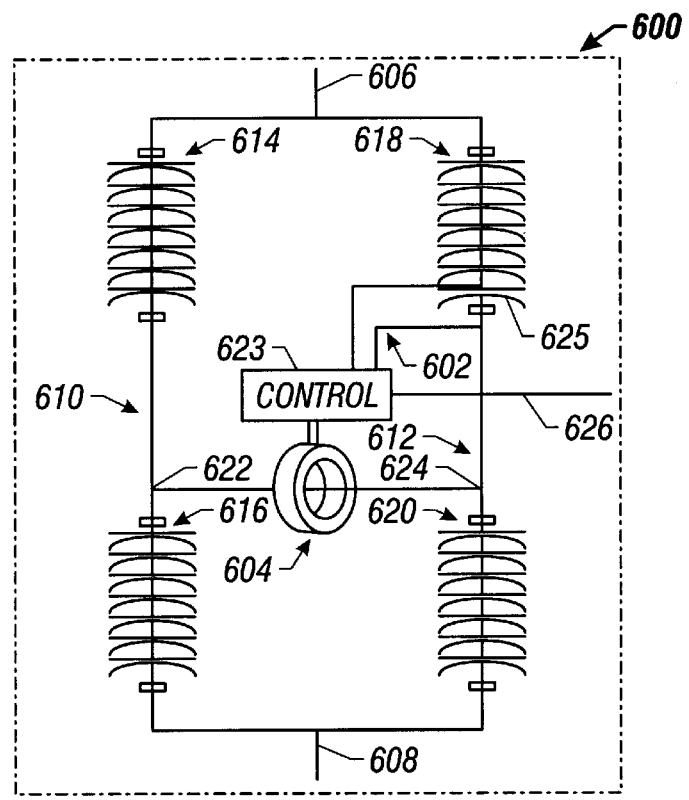
FIG. 6 is a schematic diagram of one variation of the capacitor of FIG. 1, having a capacitor voltage divider as a power input and a current transformer as a voltage differential unbalance detector.

Referring next to FIG. 6, a schematic diagram is shown of one variation of the capacitor 600 of FIG. 1 having a capacitor voltage divider power input 602 and a current transformer 604 as a voltage unbalance detector. Each of the electrodes 606, 608 of the capacitor 600 is connected to two current paths 610, 612 comprising a series of two capacitor sections in series 614, 616, 618, 620. A connection between interior nodes 622, 624 each of these current paths 610, 612 should normally not carry any current, as voltage should be balanced between these two interior nodes 622, 624. However, should an unbalance in one of the four capacitor sections in series occur 614, 616, 618, 620, current will flow through this connection inducing a voltage in the current transformer 604 and in turn at a control output. A threshold circuit 623 is powered by voltage across an individual capacitor 625 of one of the capacitor sections in series 618 so that the threshold circuit 622 can operate, for example, in a "normally on" mode. If the threshold circuit 622 is operated in a "normally . The threshold circuit 623 provides an unbalance detection output 626 for the capacitor 600 as a function of the difference in voltage at the interior nodes 622, 624.

Advantageously, the two capacitor electrodes 606, 608 and the unbalance detection output are the only connections passing through a housing 628 of the capacitor 600.

As will be recognized by the skilled artisan, the embodiment shown is somewhat arbitrary in design in that a multiplicity of current paths may be utilized each employing a multiplicity of capacitor series. Furthermore, as shown, each capacitor series is made up of seven individual capacitor sections, but a larger or smaller number of individual capacitor sections could, consistent with the teachings herein, make up each capacitor series.

In practice, if any one of the individual capacitor sections in any one of the capacitor sections in series fails, i.e., shorts, there will be a net current through the current transformer 604, triggering a response in the unbalance detection signal at the unbalance detection output. This net current will be proportional to the degree of unbalance between the two current paths. As a result, the unbalance detection output is not only indicative of unbalance, but indicative of the degree to which unbalance has occurred, and thus the degree to which capacitor failure is imminent.

The output of the threshold circuit is preferably a light source, but could in theory be an acoustic or electrical signal. Because, however, the preferred output is a light source, an optical coupling of fiberoptic cable can be used to connect threshold circuit to the control unit. Fiberoptic coupling is preferred because in high voltage circuits, capacitor operating voltage may be several orders of magnitude higher than those in the control unit and ease of coupling the signal to the external system controls.

Once the control unit detects unbalance, as indicated by the unbalance detection signal, the control unit either initiates a system shutdown or signals an impending failure, and thus the need for scheduled maintenance, depending on the degree of unbalance indicated by the unbalance detection signal. Typically shutdown is affected using, for example, an interlock, such as is known in the art.

In some applications, when the degree of unbalance is below an upper threshold, (at which shutdown would be initiated) but above a lower threshold (above noise), it may be desirable to allow the capacitor to operate even though some unbalance has been detected, so that the capacitor can be shut down for maintenance or replacement in a scheduled manner without interrupting currently operating systems. This allows a device like an experimental accelerator to continue to function until maintenance can be performed. Advantageously, because unscheduled or emergency shutdown can spoil valuable experiments, downtime costs can reach, for example, $20,000 U.S. per hour, and because having a machine unexpectedly shutdown is not desirable, the present embodiment represents a significant improvement over prior techniques, which either involve uncontrolled capacitor failure, or unscheduled shutdown.

As a matter of performance, individual capacitor sections within the capacitor are designed so that they will continue to function without causing catastrophic failure of the capacitor, even though one or more other individual capacitor sections have failed.

This ability is achieved by generating the individual capacitor sections at, for example, 80% of their maximum voltage potential, so that each individual capacitor section can handle the additional voltage burden created when one of the individual capacitor sections fail. Also, the capacitor sections should be designed so that a shortened capacitor section will not generate gas or heat at an excessive rate while awaiting scheduled maintenance. Thus, combined with the present design wherein the control unit is able to determine the difference between initial failure, a progressing failure, and an imminent catastrophic failure, allows the capacitor to remain in service for a period of time following the onset of failure.

Measurement of the degree to which failure has occurred may, for example, be made by measuring a rate of flashes of light generated by the threshold circuit and transmitted through the fiberoptic cable to the control unit. Alternatively, this measurement may involve measuring voltage on an electrical output, measuring a binary output on a fiberoptic or an electrical conductor, or any of numerous other well known equivalent means for communicating degree or amount.

The sensitivity of the above-described unbalance detection scheme varies as a function of each individual capacitor section's excess voltage capacity. In other words, if each individual capacitor section is operating at 80% of its maximum voltage, failure of other capacitor sections in series therewith may continue until each remaining capacitor section in the series is at 100% of its capacity, at which time the capacitor should be shut down in order to prevent catastrophic failure. If a greater degree of sensitivity is desired, each individual capacitor section can be operated at a smaller percentage of its maximum voltage capacity.

Sensitivity can also be increased by monitoring voltage, for example, at between more than two corresponding nodes in each current path. For example, a maximum sensitivity can be achieved if voltage at nodes between each capacitor section in each capacitor series is monitored relative to voltage at corresponding nodes in the other current path, and in such case the voltage detection circuit is far more likely to detect the failure of a single capacitor section.

If, for example, voltage between every other corresponding node is monitored, a slightly lower degree of sensitivity is achieved. And, when only a single node in each current path is monitored, such as in FIG. 6, a minimum sensitivity is achieved, which for many applications may be adequate.

Another important aspect of sensitivity is driven by the application in which the capacitor is being used. If the capacitor is being used as a filter capacitor, or a normal current is small, the unbalance current will also be small. Smaller currents are more difficult to detect when unbalance occurs. Thus, if the application is such that a smaller unbalance current is generated, a more sensitive unbalance detection scheme may be required.

Figure 7:
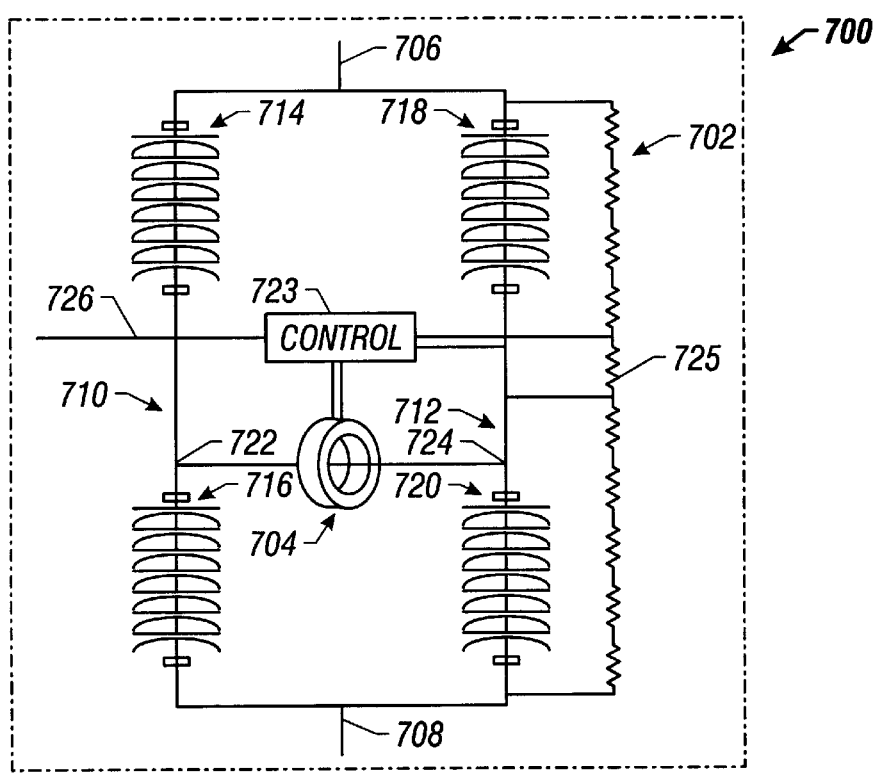
FIG. 7 is a schematic diagram of another variation of the capacitor of FIG. 1, having a resistor voltage divider as a power input and the current transformer as a voltage differential unbalance detector.

Referring next to FIG. 7, a schematic diagram is shown of another variation of the capacitor 700 of FIG. 1 having a resistor voltage divider 702 as a power input and a current transformer 704 as a voltage unbalance detector. Each of the capacitor electrodes 706, 708 of the capacitor 700 is connected to two current paths 710, 712 comprising a series of two capacitor series 714, 716, 718, 720. As with the embodiment of FIG. 6, a connection between interior nodes 722, 724 of each of these current paths 710, 712 should normally not carry any current, as voltage should be balanced between these two interior nodes 722, 724. However, should unbalance in one of the four capacitor series 714, 716, 718, 720 occur, current will flow through this connection inducing a voltage in the current transformer 704. The threshold circuit 723 is powered by voltage across an individual resistor 725 in the resistor voltage divider, which is itself connected in parallel with the current paths. (As with the embodiment of FIG. 6, this resistor voltage divider power source is needed only when the threshold circuit 723 requires a separate power source to operate, such as when it is operated in a "normally on" mode.) The threshold circuit 723 provides an unbalance detection output for the capacitor as described above.

As will be recognized by the skilled artisan, numerous variations of the illustrated embodiment are possible and contemplated by the inventors. A few of these variations are described above in reference to FIG. 6, and elsewhere throughout this patent document.

Figure 8:
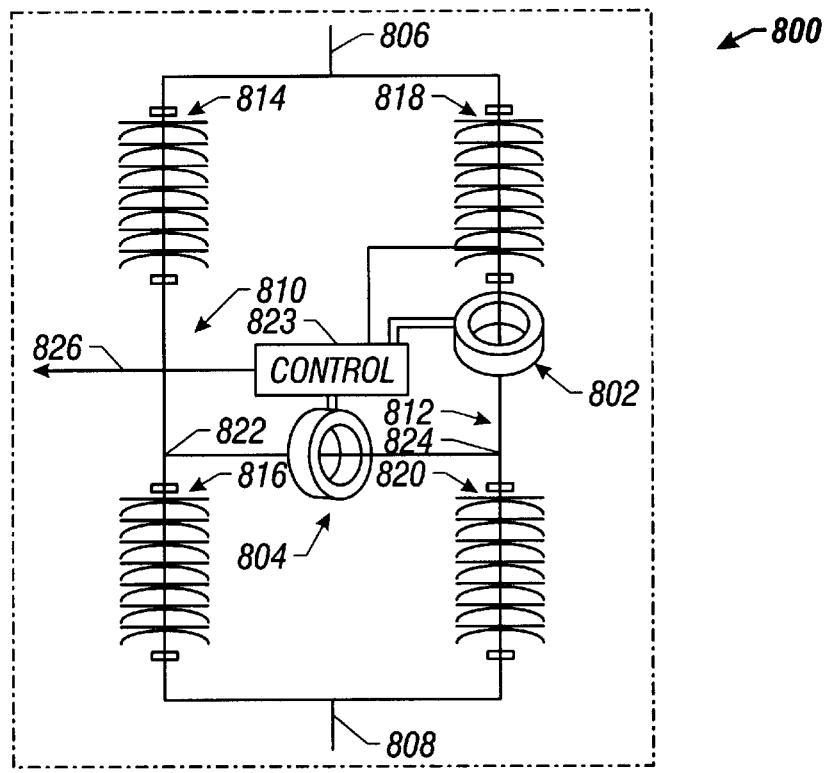
FIG. 8 is a schematic diagram of a further variation of the capacitor of FIG. 1, having a current transformer as a power input and an additional current transformer as a voltage differential unbalance detector.

Referring next to FIG. 8, a schematic diagram is shown of one variation of the capacitor 800 of FIG. 1 having a current transformer 802 as a power input and another current transformer 804 as a voltage unbalance detector. Each of the capacitor electrodes 806, 808 of the capacitor 800 is connected to two current paths 810, 812 comprising two series of capacitor sections in series 814, 816, 818, 820. As with the embodiments above, connection between interior nodes 822, 824 of each of these current paths 810, 812 should normally not carry any current, as voltage should be balanced between the two interior nodes 822, 824. However, should unbalance in one of the four series of capacitor sections 814, 816, 818, 820 occur, current will flow through this connection inducing a voltage in the other current transformer 804. Power for the threshold circuit 823 is induced by a ripple current flowing through one of the current paths 812 through the current transformer 802. (As with the embodiments above, this current transformer power source is needed only when the threshold circuit 823 requires a separate power source to operate, such as when it is operated in a "normally on" mode.) The threshold circuit 823 provides an unbalance detection output for the capacitor 800 as described above.

As will be recognized by the skilled artisan, numerous variations of the illustrated embodiment are possible and are contemplated by the inventors. A few of these variations are described above, and elsewhere throughout this patent document.

Figure 9:
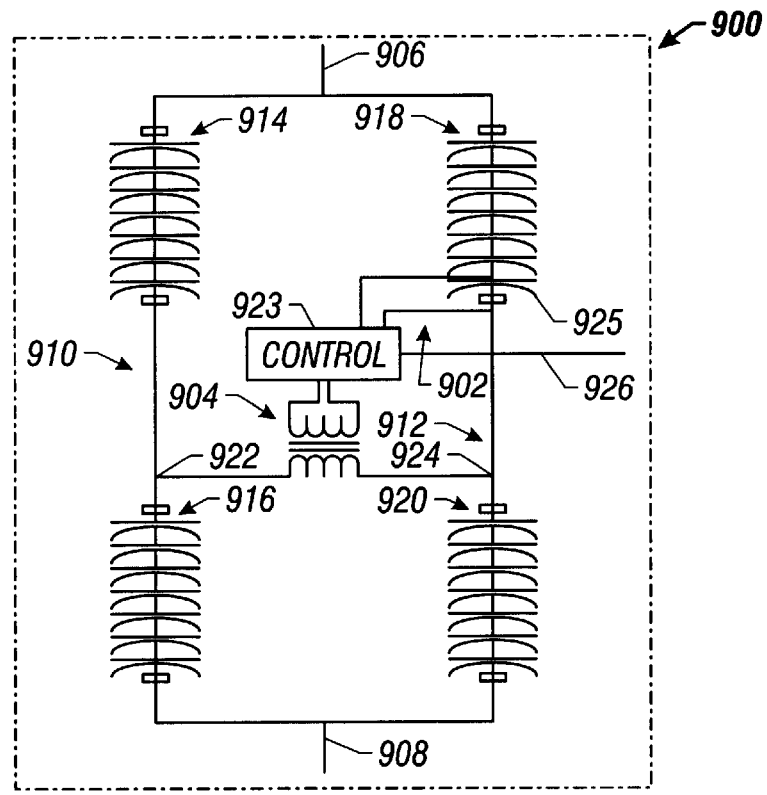
FIG. 9 is a schematic diagram of a further variation of the capacitor of FIG. 1, having a capacitor voltage divider as a power input and a potential transformer as a voltage differential unbalance detector.

Referring next to FIG. 9, a schematic diagram is shown of a further variation of the capacitor 900 of FIG. 1 having a capacitor voltage divider 902 as a power input and a potential transformer 904 as a transformer voltage unbalance detector. Each of the capacitor electrodes 906, 908 of the capacitor 900 is connected to two current paths 910, 912 comprising a series of two capacitor series 914, 916, 918, 920. As with the above embodiments, a connection through one winding of the potential transformer 904 is connected between interior nodes 922, 924 of each of these current paths 910, 912 should normally not carry any current, as voltage should be balanced between these two interior nodes 922, 924. However, should the voltage in one of the four capacitor series 914, 916, 918, 920 occur, current will flow through this connection inducing a voltage in the potential transformer 904. The threshold circuit 923 is powered by voltage across an individual capacitor section 925 of one of the capacitor sections in series 918, and provides an unbalance detection output for the capacitor as described above. (As with the above embodiments, this power source may not be needed, if, for example, the threshold circuit 923 operates in a "normally off" mode.)

As will be recognized by the skilled artisan, numerous variations of the illustrated embodiment are possible and contemplated by the inventors. A few of these variations are described above in recreance to FIG. 6 and elsewhere throughout this patent document.

Figure 10:
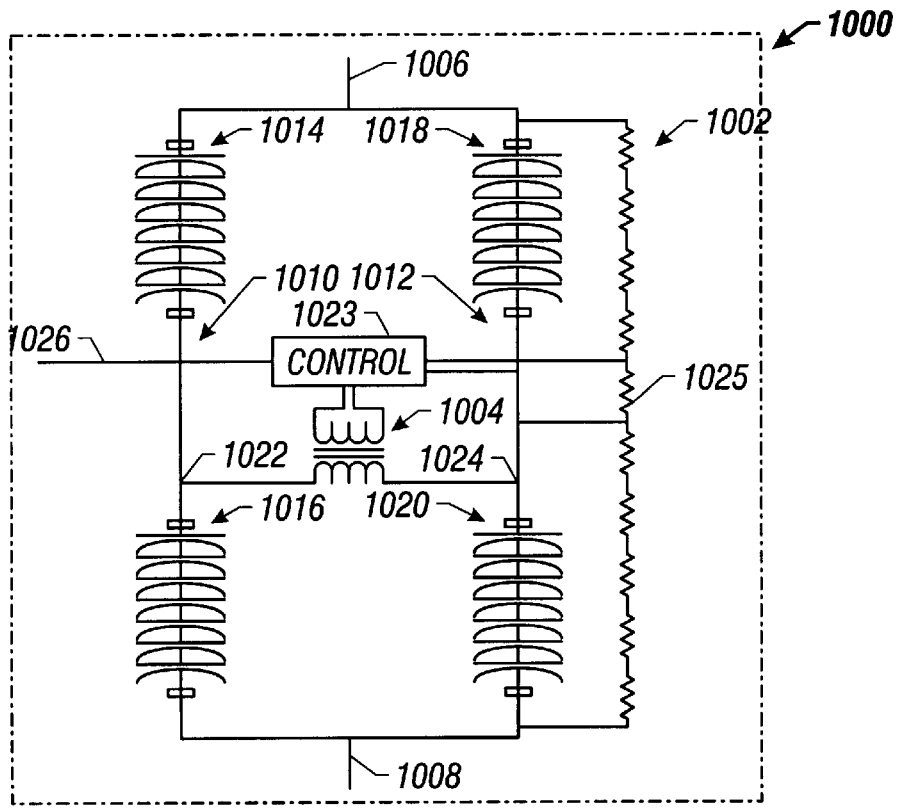
FIG. 10 is a schematic diagram of an additional variation of the capacitor of FIG. 1, having a resistor voltage divider as a power input and a potential transformer as a voltage differential unbalance detector.

Referring next to FIG. 10, a schematic diagram is shown of another further variation of the capacitor 1000 of FIG. 1 having a resistor voltage 1002 divider as a power input and a transformer 1004 as a voltage unbalance detector. Each of the capacitor electrodes 1006, 1008 of the capacitor 1000 is connected to two current paths 1010, 1012 comprising a series of two capacitor sections in series 1014, 1016, 1018, 1020. A connection through one winding of the potential transformer 1006 is connected between interior nodes 1022, 1924 of each of these current paths 1010, 1012 should normally not carry any current, as voltage should be balanced between these two interior nodes 1022, 1024. However, should the voltage in one of the four capacitor sections in series 1014, 1016, 1018, 1020 occur, current will flow through this connection inducing a voltage in the potential transformer 1004. The threshold circuit 1023 is powered by voltage across an individual resistor 1025 of the resistor voltage divider 1002, and provides an unbalance detection output for the capacitor 1000 as described above. (Again, as with the above embodiments, this power source is not needed, if, for example, the threshold circuit 1023 operates in a "normally off" mode.)

As will be recognized by the skilled artisan, numerous variations of the illustrated embodiment are possible and contemplated by the inventors. A few of these variations are described above in reference to FIG. 6 and elsewhere throughout this patent document.

Figure 11:
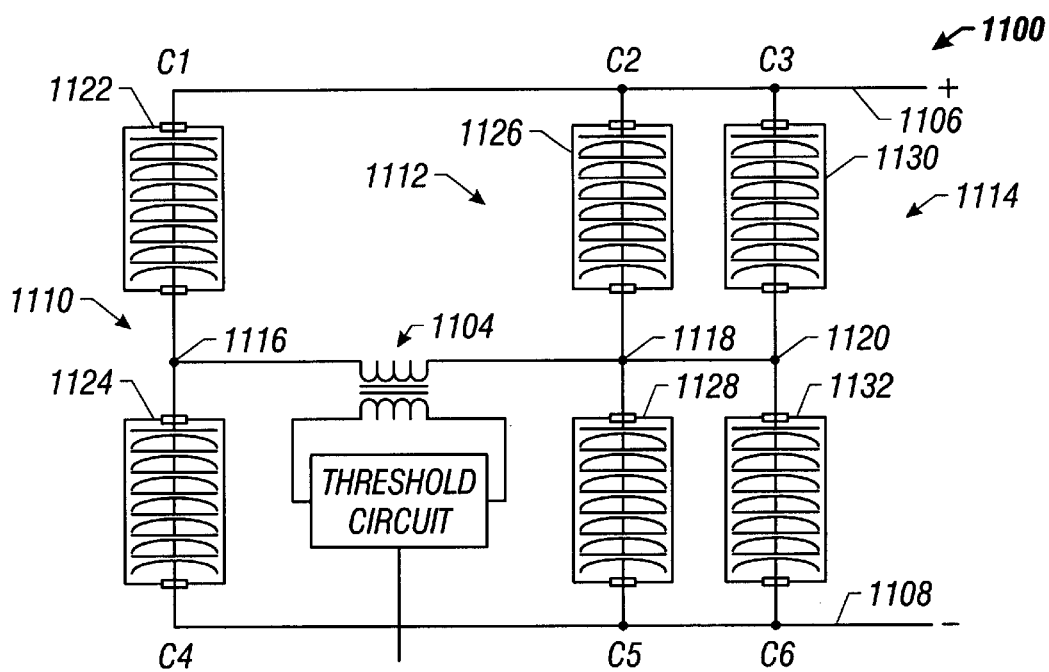
FIG. 11 is a schematic diagram of another further embodiment of the capacitor of FIG. 1, having a potential transformer as a voltage differential unbalance detector.

Referring next to FIG. 11, a schematic diagram is shown of an additional variation of the capacitor 1100 of FIG. 1 having a potential transformer 1104 as a voltage unbalance detector. Each of the electrodes 1106, 1108 of the capacitor 1100 is connected to three current paths 1110, 1112, 1114 comprising two series of capacitor sections 1122, 1124, 1126, 1128, 1130, 1132 per current path, in series. A connection between the interior nodes 1116, 1118, 1120 of each of these current paths 1110, 1112, 1114 should normally not carry any current, as voltage should be balanced between these three interior nodes 1116, 1118, 1120. However, should a change in the voltage in one of the six series of capacitor sections 1122, 1124, 1126, 1128, 1130, 1132 (two each for three current paths) occur, current will flow through this connection inducing a voltage in the potential transformer 1104. The potential transformer 1104 is interposed between a first pairing of the three interior nodes 1116, 1118 with a remaining pairing of two of the three interior nodes 1118, 1120 having a direct connection therebetween.

As will be recognized by the skilled artisan, numerous variations of the illustrated embodiment are possible.

Figure 12:
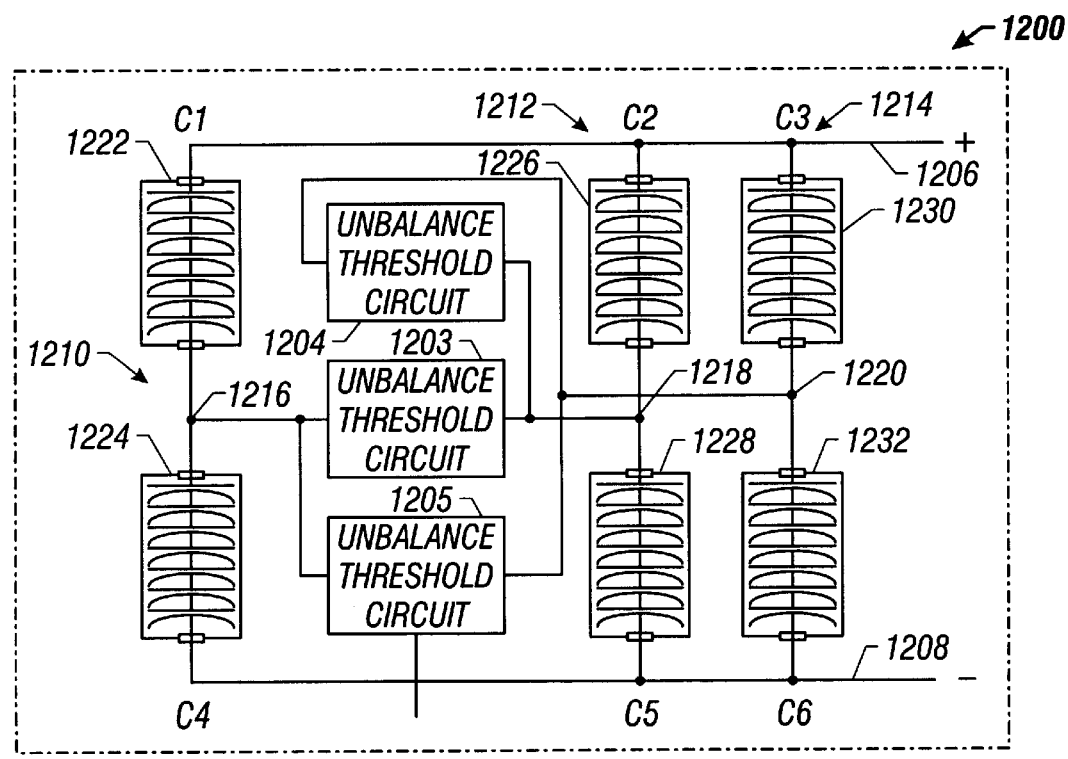
FIG. 12 is a schematic diagram of an added embodiment of the capacitor of FIG. 1 having a plurality of voltage differential unbalance detectors.

Referring to FIG. 12, a schematic diagram is shown of an added embodiment of the capacitor of FIG. 1 having a plurality of threshold circuits 1203, 1204, 1205, such as voltage potential transformers. Each of the electrodes 1206, 1208 of the capacitor 1200 is connected within the housing of the capacitor 1200 to three current paths 1210, 1212, 1214 comprising two series of capacitor sections 1222, 1224, 1226, 1228, 1230, 1232 per current path, in series. Unlike in the embodiment of FIG. 11, however, each corresponding pair of interior nodes 1216, 1218, 1220 is connected through a voltage unbalance detector 1203, 1204, 1205 such that unbalance is monitored between the interior nodes of a first pair of the current paths 1210, 1212 by a first voltage unbalance detector 1203, between a second pair of the current paths 1212, 1214, by a second voltage unbalance detector 1204, and between the interior nodes of the third pair of current paths 1210, 1214, by a third voltage unbalance detector 1205. None of these connections between the interior nodes 1216, 1218, 1220 of these current paths of 1210, 1212, 1214 should normally carry current, as well as should be balanced between the three interior nodes 1216, 1218, 1220. However, should an unbalance occur in one of the six series of capacitor sections 1222, 1224, 1226, 1228, 1230, 1232 current will flow through the two voltage unbalance detectors connected to the interior node of the current path containing the failed series of capacitor sections. Unlike with the embodiment of FIG. 10, however, sensitivity is increased in the embodiment shown in that if one of the series of capacitor sections fails in a first current path, and another of the series of capacitor sections fails in a second of the current paths, such failures will be both be detected even though voltage will appear to be balanced between these two current paths having a failed series of capacitor sections.

As will be recognized by the skilled artisan, numerous variations of the illustrated embodiment are possible, and the teachings present in the illustrated embodiment could be applied to numerous other embodiments shown in the present patent application in order to increase their sensitivity. For example, multiple current transformers could be employed to increase sensitivity in the embodiment of FIG. 15, described below, wherein current flowing through each of three possible pairs of current paths passes through one of three respective differential current transformers, each coupled to one of three respective threshold circuits.

Figure 13:
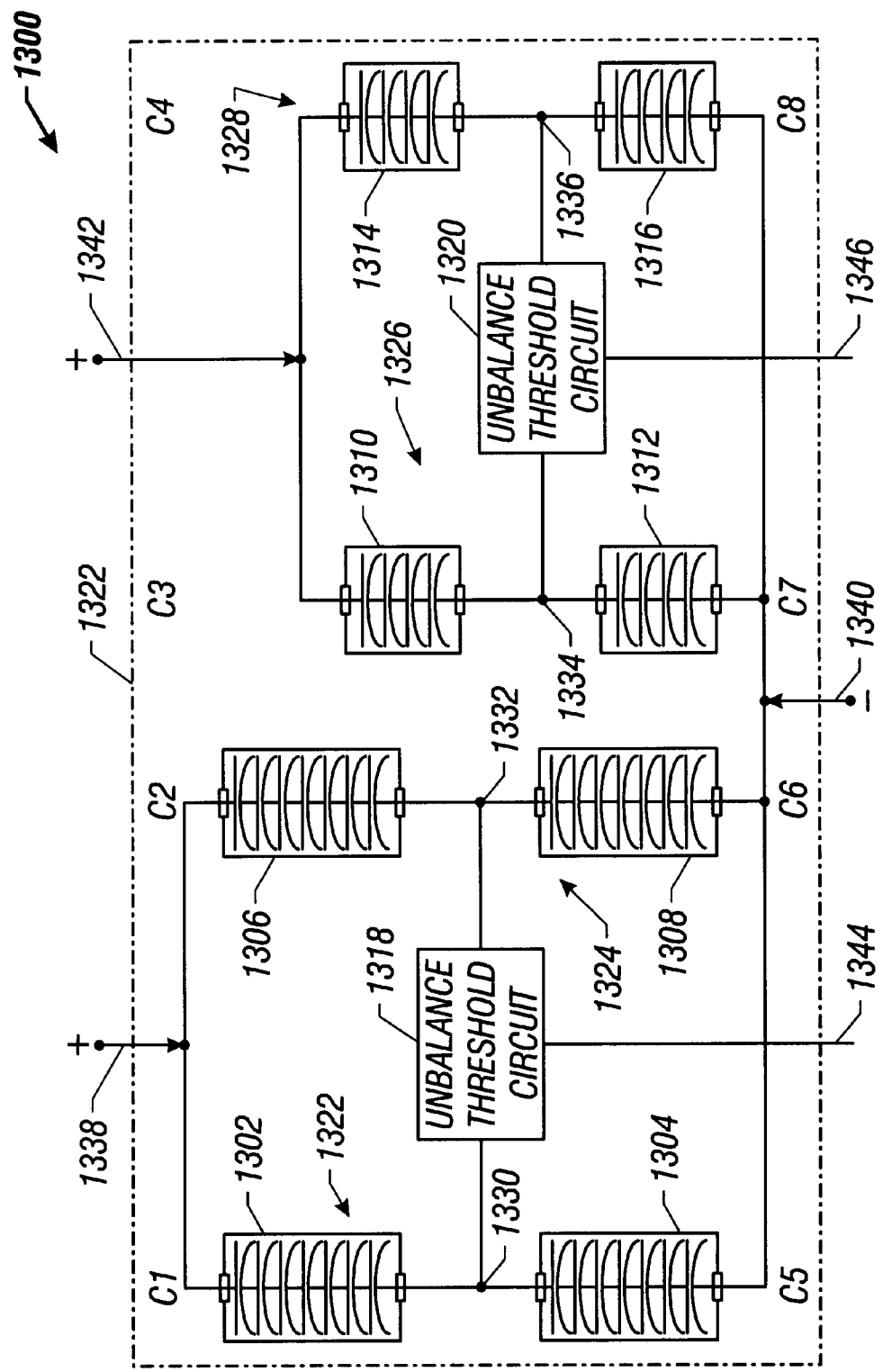
FIG. 13 is a schematic diagram of a further added embodiment of the capacitor of FIG. 1 having a plurality of capacitor banks, each with a respective voltage differential unbalance detector, and being commonly used in a single casing.

Referring next to FIG. 13, a schematic diagram is shown by further added embodiment of the capacitor 1300 of FIG. 1 having a plurality of series connected pairs of series of capacitor sections 1302, 1304, 1306, 1308, 1310, 1312, 1314, 1316, connected in parallel, each with respective voltage differential unbalance detectors 1318, 1320, and all being commonly housed in a single casing 1322. As shown, each of the series connected pairs forms one of four distinct current paths 1322, 1324, 1326, 1328, having an interior node 1330, 1332, 1334, 1336 therebetween. Each interior node 1330, 1332, 1334, 1336 is connected through a respective threshold circuit 1318, 1320 to another of the interior nodes 1330, 1332, 1334, 1336. Respective pairs of the current paths 1322, 1324, 1326, 1328 are connected between either a first electrode 1338 and a second electrode 1340 or a third electrode 1342 and the second electrode 1340. The first pair of the current paths 1322, 1324 is connected between the first electrode 1338 and the second electrode 1340, and is coupled together at the interior nodes 1330, 1332 of each of the first pair of current paths 1322, 1324 through a first of the threshold circuits 1318. The remaining pair of current paths 1326, 1328 is coupled between the third electrode 1342 and the second electrode 1340. Another threshold circuit 1320 couples interior nodes of the third current path 1326 and the fourth current path 1328 to one another. A common housing 1322 encloses the entire device with only the first, second and third electrodes 1338, 1340, 1342, the two respective unbalance detection outputs 1344, 1346 being provided outside the casing by the threshold detectors 1318, 1320.

Other than exhibiting the unique structure involving two distinct capacitor structures (parallel connected series of capacitor sections in series) formed into a single capacitor 1300 within a single casing 1322, each with a threshold circuit, the embodiment illustrated in FIG. 13 operates in its preferred variation similarly to embodiments described above in reference to FIGS. 6 and 7, or in reference to FIGS. 9 and 10. Accordingly further explanation of the operation of the embodiment shown in FIG. 13 is not made herein.

As will be appreciated by the skilled artisan, numerous variations of the embodiment shown can be made consistent with the teachings made herein, and such are contemplated by the inventors. Further, other embodiments illustrated herein can easily be modified with the teachings of the present embodiment, as such is also contemplated by the inventors.

Figure 14:
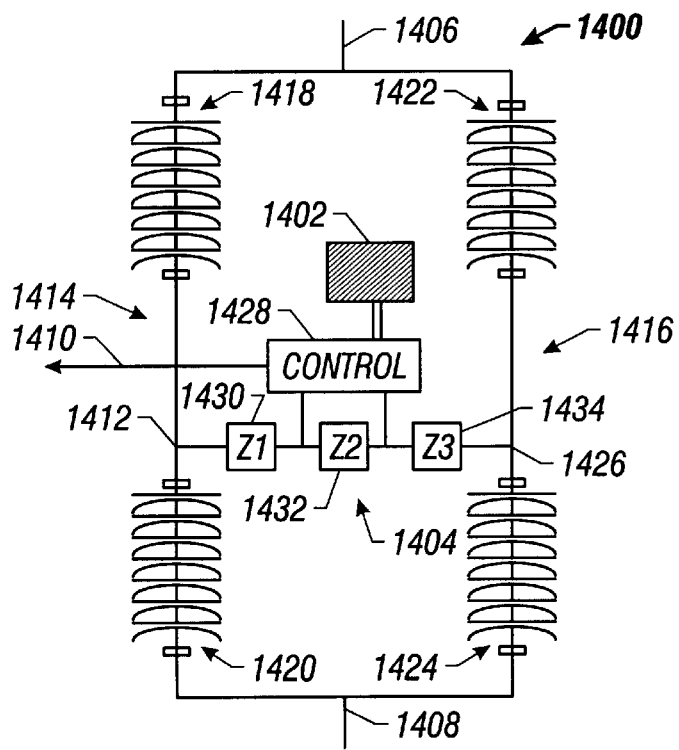
FIG. 14 is a schematic diagram of another additional embodiment of the capacitor of FIG. 1, having a voltaic or photo voltaic cell array as a power input and a signal impedance divider as a voltage differential unbalance detector.

Referring next to FIG. 14, a schematic diagram is shown of another additional embodiment of the capacitor 1400 of FIG. 1, having a photo voltaic cell array 1402 as a power input and an impedance divider 1404 as a voltage unbalance detector. A voltaic cell, such as an electrochemical battery, could also be used in this embodiment. The capacitor 1400 is shown as having three terminals 1406, 1408, 1410, including the two electrodes 1406, 1408, and the unbalance detection output 1410. The photo voltaic cell array 1402 can be used as a power source in any situation where it receives enough light to operate the threshold circuit 1428, such as where the capacitor 1400 is used in an outdoor environment, where the photo voltaic cell array can be located outdoors and remotely from the capacitor 1400 or where the capacitor 1400 is in a lighted area. If there is not enough light available, voltaic cells (batteries) can be used. As with the embodiments above, this photo voltaic power cell array is only needed where the threshold circuit 1428 requires a separate power source, such as when the threshold circuit 1428 is operated in a "normally on" mode. The capacitor 1400 employs the impedance divider 1404 between a central node 1412 of a first current path 1414 and a central node 1426 of a second current path 1416. Each current path 1414, 1416 is connected between each of the electrodes 1406, 1408 such that the current paths 1414, 1416 are in parallel relative to one another. Each current path 1414, 1416 consists of a pair of capacitor series 1418, 1420, 1422, 1424 with the central node 1412, 1426 therebetween.

The impedance divider 1404 is provided for the purpose of reducing signal amplitude to something useable by a threshold circuit 1428. The impedance divider 1404 is made up of three discrete impedances 1430, 1432, 1434. Across a second or center of the three impedances 1432, the threshold circuit detects measured voltage, with signal attenuation being equal to Z2/(Z1+Z2+Z3), where impedances can be any combination of capacitances, inductance or resistance.

While a particular configuration is shown in FIG. 14, it will be appreciated by the skilled artisan that the embodiment of FIG. 14 lends itself to combination with the various other embodiments herein described where attenuation of signal amplitude is desirable.

Figure 15:
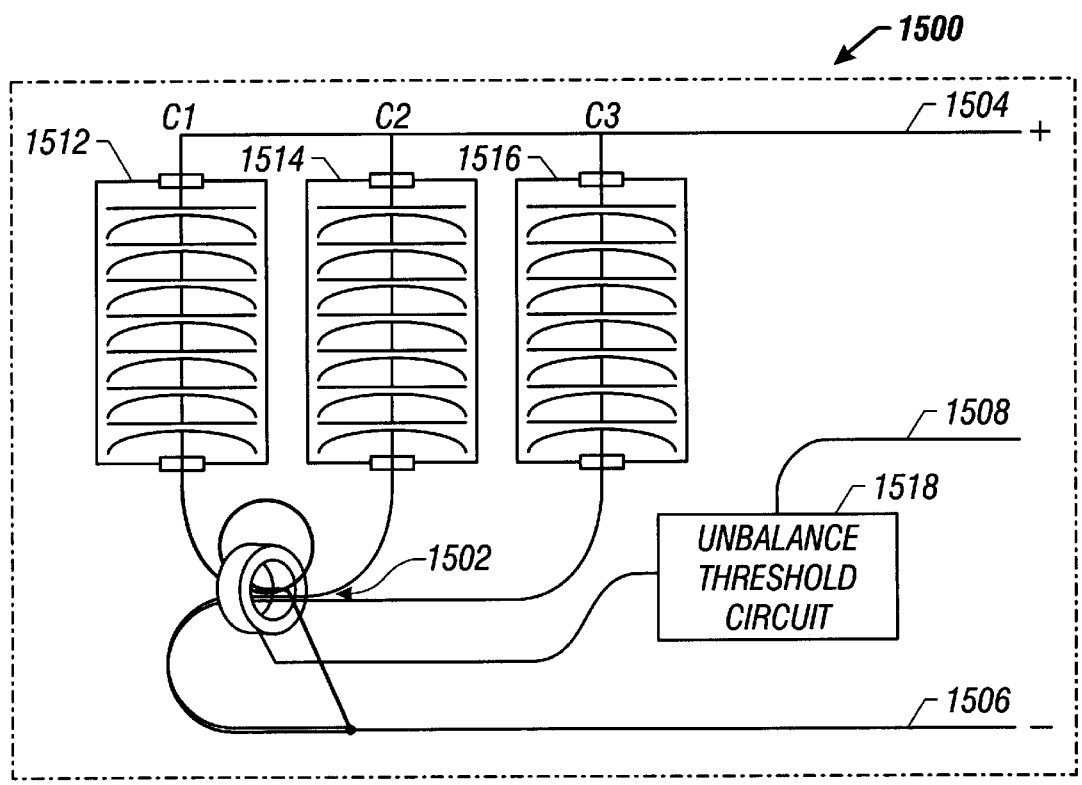
FIG. 15 is a schematic diagram of a further additional embodiment of the capacitor of FIG. 1 having a current transformer as a current differential unbalance detector.

Referring next to FIG. 15, a schematic diagram is shown of a further additional embodiment of the capacitor 1500 of FIG. 1 having a differential current transformer 1502 as a current unbalance detector. As shown, the capacitor 1500 has three terminals 1504, 1506, 1508, including the two electrodes 1504, 1506, and an unbalance detection output 1508. In the embodiment shown, three parallel capacitor sections in series 1510, 1512, 1514 are connected between each of the capacitor electrodes 1504, 1506. The capacitor sections in series 1512, 1514, 1516 are connected to the second electrode 1506 through the differential current transformer 1506 with the connection from first of the capacitor series 1512 passing through the differential transformer 1502 twice, and a connection from each of the remaining capacitor series 1514, 1516 passing through the differential transformer 1514, 1516 once. In accordance with the present embodiment, current flowing from the first capacitor series 1512 passes through differential current transformer 1502 in a first direction and current from each of the other capacitor sections in series 1514, 1516 pass through differential transformer 1502 in another direction. Thus, assuming that currents are equal, the net current through the differential transformer 1502 is zero, which would be the case when there has been no failure in any capacitor sections in the capacitor series 1512, 1514, 1516. Upon failure of a capacitor section in one of the capacitor sections in series 1512, 1514, 1516, net current through the differential transformer 1502 will no longer be zero, and furthermore, will be proportional to the unbalance. This allows a threshold circuit 1518 to determine the source and degree of unbalance and indicate such at the unbalance detection output 1508.

As with the above embodiments, the skilled artisan will appreciate the numerous variations of the illustrated embodiment that are possible and contemplated by the inventors.

Figure 16:
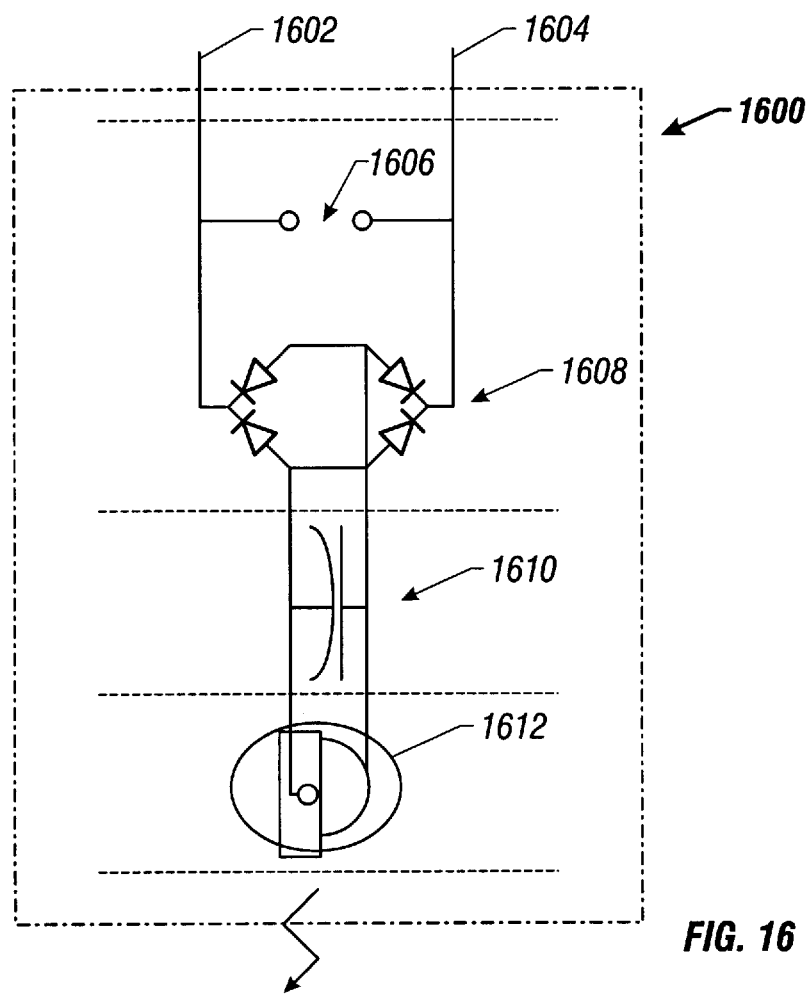
FIG. 16 is a schematic diagram of a threshold detection circuit for generating an optical output in the embodiments of, for example, FIGS. 6 through 12.

Referring next to FIG. 16, a schematic diagram is shown of an exemplary threshold circuit 1600 for generating an optical output or light output in the embodiments of FIGS. 6 through 15. In the embodiment shown, an unbalance detection signal is provided to a threshold circuit through two input electrodes 1602, 1604. Between the two input electrodes 1602, 1604 is positioned to spark gap 1606, for purposes of over-voltage protection, and a rectifier 1608. An output of the rectifier 1608 is applied across a capacitor 1610 and to a light source 1612, such as a neon lamp, having breakdown voltage at which it emits light.

In practice, as a charge builds on the capacitor 1610, also referred to as a signal accumulator, current in the light source 1612 is zero. As the voltage across the capacitor 1610 meets or exceeds the breakdown voltage for the light source 1612, however, the light source 1612 will flash, thereby discharging the signal accumulator, i.e., the capacitor 1610. The rate at which the signal capacitor 1610 then recharges is a function of the degree of unbalance. In turn, the rate at which the light source 1612 flashes is thus a function of the degree of unbalance. From this the control unit determines the degree of unbalance. If the degree of unbalance is below a second threshold but above a first threshold (a noise threshold) a signal is generated to signal that scheduled maintenance needs to be performed. If the degree if unbalance is above the second threshold, shutdown of the capacitor is initiated in order to avoid catastrophic failure. The control unit may consist of a counter for counting the number of flashes of light over a period, and a clock for measuring the period. At the end of the period, logic circuitry can be used to initiate an appropriate response in response to the value in the counter.

Alternatively, the threshold circuit could be an MOV or other active element functioning alone or in combination with passive components like capacitors and resistors. Once the signal is received by the threshold circuit, it can be rectified with a full wave bridge.

Referring next to FIG. 17, shown is a block diagram of a capacitor 1700 such as shown in FIG. 1 which is made up of smaller capacitor units 1703 such as is shown by FIG. 5 and a capacitor control system 1702 which controls the capacitor 1700 while allowing a widely varying reference voltage on the capacitor 1700 without need for recalibration of the capacitor control system 1702.

The capacitor 1700 comprises two capacitor units 1703 analogous to the capacitor of FIG. 5, connected in series with each other capacitor unit 1703. Each capacitor unit 1703 has a plurality of individual capacitor subunits 1704 in series and a threshold circuit 1706, 1722 which may further comprise, for example, the voltage unbalance detection circuit 410, and the voltage detector 426 of FIG. 4 or the current unbalance detection circuit 510, and the current detector 526 of FIG. 5. The capacitor subunits 1704 further comprise a plurality of capacitor sections 1729 in parallel with each other.

The capacitor 1700 is enclosed within a capacitor housing 1708, represented with a dashed line from which each of two capacitor electrodes 1710, 1712 extend, along with a signal output 1730.

Outside the capacitor housing 1708, the capacitor electrodes 1710, 1712 are connected outside the capacitor 1700 to a high voltage bus 1732 and to a ground potential bus 1734, respectively. Within the capacitor housing 1708, the capacitor electrodes 1710, 1712 are also connected to current paths 1716, 1718, each consisting of one of a first pair of the capacitor subunits 1704 in series with a node 1720 or 1724 in series with one of a second pair of the capacitor subunits 1704 in series with another node 1723 or 1727, and one of a third pair of the capacitor subunits 1704 in series with a further node 1721, 1725 in series with one of a fourth pair of the capacitor subunits 1704.

The threshold circuit (current detector) 1706 is interposed between the node 1720 in the first current path 1716 and the node 1724 in the second current path 1718 in order to measure voltage differences between the nodes 1720, 1724 in the current paths 1716, 1718. Another threshold circuit 1722 compares voltages between similar nodes 1720, 1724 in lower halves of each of the current paths 1716, 1718. Interior nodes 1723, 1727 are shorted together.

The threshold circuits 1706, 1722 generate an unbalance detection output 1726 as a function of differences between voltages at the nodes 1720, 1724, and the further nodes 1721, 1725, respectively, of each of the current paths 1716, 1718, respectively. When an unbalance occurs between capacitor subunits 1704 in upper halves of the current paths 1716, 1718, current will flow between the nodes 1720, 1724 and when an other unbalance occurs between capacitor subunits 1704 in lower halves of the current paths 1716, 1718, a further current will flow between the further nodes 1721, 1725. When this current or further current is more than a threshold amount, the respective threshold circuit 1706 or 1722 indicates an unbalance in an unbalance detection signal 1726 (such as a series of light pulses at an increased rate through a fiber optic cable) at the signal output 1730. The threshold circuit 1706 is preferably a high impedance device such as a voltage detector, with the current flowing between the nodes 1720 and 1724 or the further nodes 1721 and 1725 as a result of unbalance being very small.

The use of the multiple threshold detectors 1706 and 1722 provides improved sensitivity to the capacitor control system 1702.

For each of two capacitor units 1703, the threshold detectors 1706, 1722 combine their unbalance detection signals 1726 at the signal output 1730.

The signal output 1730 provides output signals to the capacitor control system 1702.

The capacitor control system 1702 comprises a comparison circuit 1732 and a Reference Voltage Measuring Circuit 1734.

The Reference Voltage Measuring Circuit 1734 further comprises a Capacitor Voltage Divider 1742 connected across the high voltage bus 1732 and the ground potential bus 1734. A voltage measured across one of the capacitor sections of the capacitor voltage divider 1742 provides a measure of the total voltage across the high voltage bus 1732 and the ground potential bus 1734. The Capacitor Voltage Divider 1742 may be, for example, a 100 to 1 divider and thus the measure of voltage across the capacitor section of the capacitor voltage divider is about 100 times less than the total voltage across the high voltage bus 1732 and the ground potential bus 1734. An output of the Capacitor Voltage Divider 1742 is connected to a reference threshold detector 1744 which provides a second pulse input to a second pulse counter 1738 described below. (A pulse rate of the second pulse input is a function of measured voltage.)

The Comparison Circuit 1732 comprises a first pulse counter 1736 comprising a plurality of counters (one for each capacitor unit 1703 or capacitor subunit 1704) receiving a pulse input from the signal output 1730, and sending a first pulse output to a pulse count comparison circuit 1740, and the second pulse counter 1738 receiving the second pulse input from the reference voltage measuring circuit 1734 and providing a second pulse output to the pulse count comparison circuit 1740. The pulse count comparison circuit 1740 determines a state of the capacitor as either "normal", "alarm", or "stop", as to be detailed later herein, as a function of a comparison of the first pulse output and the second pulse output.

The Comparison Circuit 1732 compares pulse rates derived from pulse counts resulting from any detected unbalance in the capacitor 1700 with pulse rates derived from pulse counts resulting from the applied voltage measured by the capacitor voltage divider 1742. Since a typical capacitor has some measurable unbalance associated with normal capacitance variations of the capacitor 1700, a normal unbalance voltage seen by the threshold detectors 1706, 1722 will be a known value, for example on the order of 0.25% of a bus voltage, depending on the sensitivity of the particular design selected for a particular application. Control settings within the Comparison Circuit 1732 can be set according to unbalance as a percentage of reference voltage applied by the bus 1732, 1734. (Note that in many applications the voltage applied by the bus 1732, 1734 will be fixed or known, so the reference Voltage Measuring Circuit 1734 will not be needed. However, where the voltage applied by the bus 1732, 1734 is variable, the present embodiment is particularly advantageous, allowing various degrees of unbalance to be triggered as a percentage of reference voltage.)

Unbalance increases as a percentage of bus voltage as one or more capacitor sections 1729 of the capacitor subunit 1704 start to fail. In general, 0–4 failed capacitor sections 1729 corresponds respectively to about 0.25%, 0.99%, 2.70%, 6.38% and 20% of the reference voltage for the particular embodiment shown. Numerous other designs, however, are contemplated and these percentages will vary as a function of design, e.g., as a function of sensitivity. A capacitor designed to be more sensitive would have larger differences between in these percentages, thus creating larger differences a noise level and a signal level, with, for example, only one capacitor section 1729 shorted. In the design shown, when one capacitor section 1729 in one capacitor subunit 1704 shorts out, expected unbalance (as a percentage of reference voltage) is increased by a factor of 4.

A capacitor unbalance is determined as a percentage value of the reference voltage (unbalance/reference voltage) by comparing the pulse rates of the first pules input from the capacitor 1700 with the pulse rates of the second pulse input from the Capacitor Voltage Divider 1734, and a state determination is made. For example, in the case of a 100 to 1 Voltage Divider, one pulse could represent 100 total pulses from the reference voltage.

Each control setting is determined according to a predetermined minimum and/or maximum range. In one embodiment (based on the percentages above, for the illustrated embodiment), a "normal" condition is set for an unbalance range up to and including 0.50%; an "alarm" condition is set for an unbalance range between greater than 0.50% and less than or equal to 1.5% of the reference voltage; and a "stop" condition is set for an unbalance range over 1.5% of the reference voltage.

Therefore, if the voltage divider 1742 produces 2 counts for every 1 count produced by the capacitor 1700, it represents a 1/200, or 0.5% unbalance/reference voltage value which would correlate to an "alarm" condition. Similarly, a "stop" condition would be set if 1.5 pulses were detected from the capacitor 1700 for every 1 pulse from the voltage divider 1734, corresponding to a 1.5% unbalance/reference voltage value.

Advantageously, the capacitor control system 1702 is able to provide unbalance detection control even with heavy changes in the voltage on the high voltage bus 1732 and ground potential bus 1734, without having to be adjusted or recalibrated because of a change in voltage. This is especially significant in pulse power applications wherein the bus voltage, or reference voltage, can vary widely, operating at different levels, charging and discharging the capacitor 1700.

Referring next to FIG. 18, a variation of the capacitor control system 1702 of FIG. 17 is shown. A capacitor control system 1802 is shown wherein a resistor voltage divider 1842 replaces the capacitor voltage divider 1742 of FIG. 17, structurally and functionally.

The capacitor control system 1802 operates in an analogous fashion to that of FIG. 17 described above.

Figure 19:
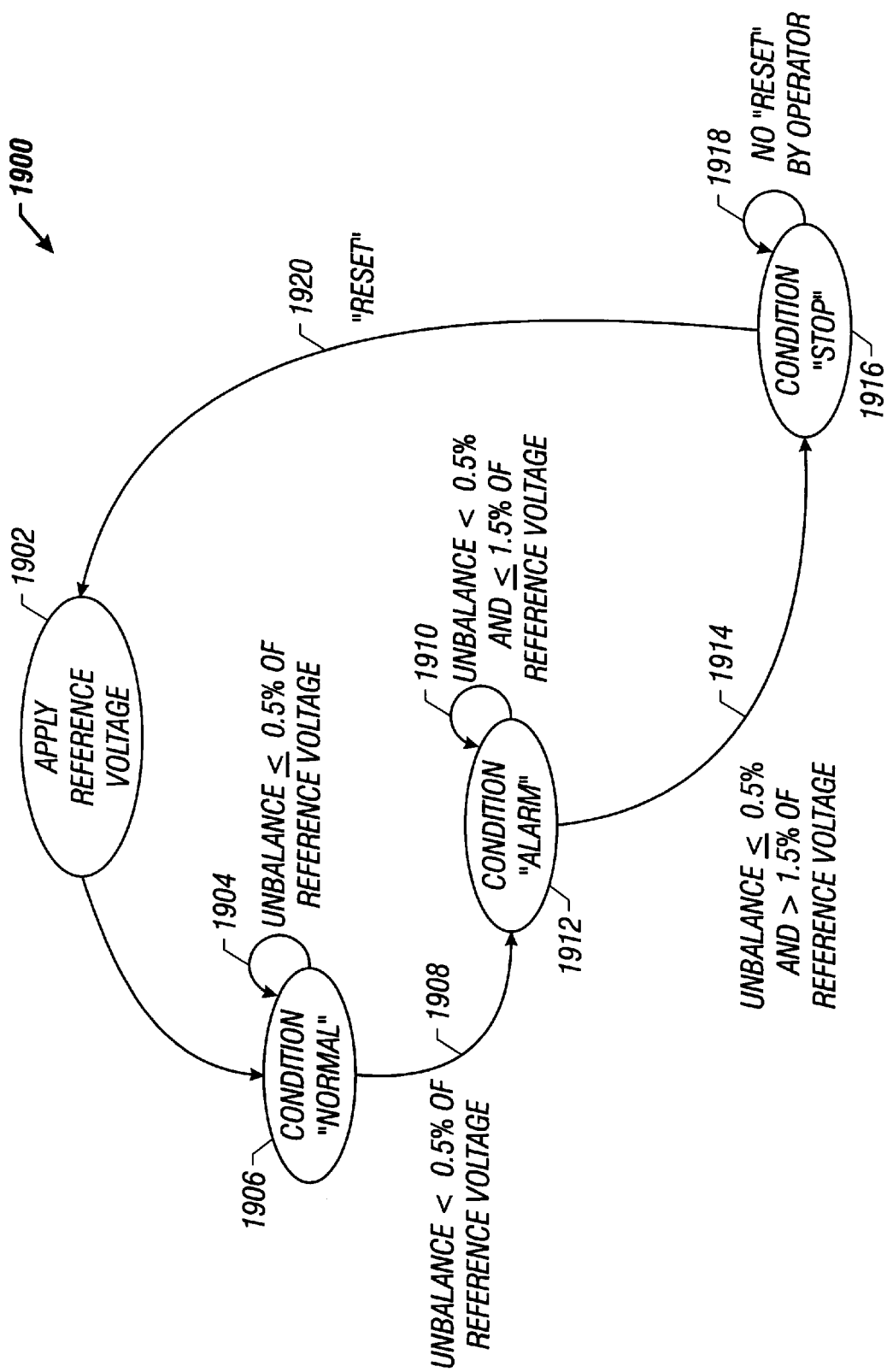
FIG. 19 is a state diagram of the capacitor control system of FIG. 17 and FIG. 18, showing three states of the system, "normal", "alarm", and "stop"

Referring next to FIG. 19, a state diagram 1900 is shown for the operation of the capacitor 1700 and capacitor control system 1702, 1802 of FIG. 17, 18.

After applying a reference voltage (1902) as described earlier, a determination is made of the value of unbalance to reference voltage. If the first comparison results in an unbalance/reference voltage value (value) of <=0.5% (1904), the state of the system is "normal" (1906), and reference voltage continues to be applied. If the value is NOT <=0.5% (1908), there is an initial unbalance. If the value is >0.5% and <=1.5% (1910), then an "alarm" condition is set and an alarm 1912 is sounded. If subsequently the value is <=0.5% or >1.5% (1914) a "stop" 1916 condition is set. (Note that, as shown, a decrease in the detected unbalance also triggers the "stop" 1916 condition. This is because a capacitor can "appear" to become balanced again when in fact what has happened is a capacitor section in an opposing subunit has failed, resulting in voltages at the nodes that are once again the same. As a result, a return to a "balanced" state, also signals a "stop" 1916 condition.) If, after the "stop" 1916 condition is reached, the operator does not "reset" 1918 the capacitor control system, the "stop" 1916 condition continues and the application of voltage to the capacitor 1700 is discontinued. Upon a "reset" 1920 operation by the operator the capacitor control system 1702 starts the application of voltage again to the capacitor 1700.

While the invention herein disclosed has been described by means of specific embodiments and applications thereof, numerous modifications and variations could be made thereto by those skilled in the art without departing from the scope of the invention set forth in the claims.

While the above description and embodiments assume high voltage applications, the methods and structures described may also be used with low voltage direct or alternating current applications.

Furthermore, the above description assumes that capacitors will always have a failure mode of shorting out. In some cases, the impedance of the individual capacitors may increase rather than decrease. This would be true, for example, if the capacitors were protected by internal fuses, or self-clearing electrodes are employed. Consistent with the teachings herein, detection schemes can easily be used for detecting increases in individual capacitor impedance and signaling failures accordingly.

What is claimed is:

1. A capacitor and capacitor control system comprising:

a housing;

a first plurality of capacitor sections in a first series within the housing;

a second plurality of capacitor sections in a second series within the housing;

a first electrode coupled to a first terminal of the first series, and a first terminal of the second series, the first electrode being electrically contactable outside the housing;

a second electrode coupled to a second terminal of the first series, and a second terminal of the second series, the second electrode being contactable outside the housing; and means for comparing performance of the first series with performance of the second series, for detecting an unbalance in the first series and the second series, and for generating one or more signals in response thereto, the signal varying as a function of the unbalance.

2. The capacitor of claim 1 and a capacitor control system of claim 1 further including:

means for measuring a reference voltage that represents a voltage applied across the capacitor;

a comparison circuit for receiving the signal, coupled to the means for comparing and to the means for measuring the reference voltage, for comparing the unbalance to the reference voltage and computing the unbalance as a function of the reference voltage;

a signal output coupled to said means for comparing, receiving said one or more signals and transmitting a resultant signal of said one or more signals to said comparison circuit; and means for selecting control settings for the capacitor to prevent catastrophic capacitor failure based upon the function.

3. The capacitor and capacitor control system of claim 2 wherein the function is a ratio of the unbalance to the reference voltage.

4. The capacitor and capacitor control system of claim 2 wherein the function is a percentage of the unbalance to the reference voltage.

5. The capacitor and capacitor control system of claim 2 wherein the comparison circuit categorizes the function into one of a plurality of conditions corresponding to a plurality of predetermined ranges for the function, the predetermined ranges constant for the capacitor irrespective of the reference voltage.

6. The capacitor and capacitor control system of claim 5 wherein the plurality of conditions includes a balanced condition, an alarm condition, and a shut-down condition, corresponding respectively to a normal capacitance situation, an incipient failure situation, and an imminent failure situation.

7. The capacitor and capacitor control system of claim 5 wherein if the function corresponds to the balanced condition, the capacitor continues to operate.

8. The capacitor and capacitor control system of claim 5 wherein if the function corresponds to the alarm condition, an alarm signal is sent from the comparison circuit.

9. The capacitor and capacitor control system of claim 5 wherein if the function corresponds to the shut-down condition, a shut-down signal is sent from the comparison circuit requesting that the power to the capacitor be turned off.

10. The capacitor and capacitor control system of claim 5 wherein the means for measuring the reference voltage comprises a reference capacitor voltage divider.

11. The capacitor and capacitor control system of claim 5 wherein the means for measuring the reference voltage comprises a reference resistor voltage divider.

12. The capacitor and capacitor control system of claim 10 wherein the means for measuring the reference voltage further comprises a reference threshold detector coupled at an input to the reference capacitor voltage divider.

13. The capacitor and capacitor control system of claim 11 wherein the means for measuring the reference voltage further comprises a pulse counter coupled to an output of the threshold detector.

14. The capacitor and capacitor control system of claim 5 wherein the means for comparing comprises a current unbalance detection circuit.

15. The capacitor and capacitor control system of claim 5 wherein the means for comparing comprises a plurality of current unbalance detection circuits placed in parallel with each other current unbalance detection circuit.

16. The capacitor and capacitor control system of claim 5 wherein the means for comparing comprises a differential current transformer.

17. The capacitor and capacitor control system of claim 5 wherein the means for comparing comprises a current transformer.

18. The capacitor and capacitor control system of claim 5 wherein the means for comparing comprises a potential transformer.

19. The capacitor and capacitor control system of claim 5 wherein the means for comparing comprises an impedance divider.

20. The capacitor and capacitor control system of claim 5 wherein the means for comparing comprises a differential voltage transformer.

21. The capacitor and capacitor control system of claim 5 wherein the housing comprises a non-conductive surface.

22. The capacitor and capacitor control system of claim 5 wherein the housing comprises a plastic insulated surface.

23. The capacitor and capacitor control system of claim 5 wherein said first series and said second series comprise a low voltage capacitor bank characterized by a maximum voltage of 5 kilovolts.

24. The capacitor and capacitor control system of claim 5 wherein said first series and said second series comprise a high voltage capacitor bank characterized by a minimum voltage of 10 kilovolts.

25. The capacitor and capacitor control system of claim 5 wherein the means for comparing comprises means for measuring differences at a plurality of corresponding nodes between a plurality of capacitor sections in each of said first series and said second series.

26. The capacitor and capacitor control system of claim 1 wherein said signal output comprises a fiber optic conductor.

27. The capacitor and capacitor control system of claim 1 wherein said signal output comprises a sound generator.

28. The capacitor and capacitor control system of claim 1 wherein said signal output further comprises an acoustic waveguide.

29. The capacitor and capacitor control system of claim 1 wherein said signal output further comprises a voltage isolator.

30. The capacitor and capacitor control system of claim 1 wherein said signal output further comprises electrical conductors.

31. The capacitor and capacitor control system of claim 1 wherein said signal varies from a signal indicating a balanced condition, incipient failure, and immanent failure as a function of a degree of capacitor failure.

32. A method of operating a capacitor comprising:
coupling a first electrode of the capacitor to a capacitor control system;
coupling a second electrode of the capacitor to the capacitor control system;
applying a voltage across the first and second electrodes;
detecting an unbalance within the capacitor;
measuring a reference voltage representative of the voltage across the first and second electrodes;
determining an unbalance function as a ratio of the unbalance to the reference voltage;
determining whether the unbalance, as represented by the unbalance function, is greater than a first threshold and less than a second threshold;
signaling the unbalance in the event the unbalance function is greater than a first threshold and less than a second threshold;
determining whether the unbalance function is greater than the second threshold; and
initiating a shutdown of the capacitor in the event the unbalance function is greater than the second threshold.

33. The method of claim 32 wherein the detecting of the unbalance within the capacitor comprises comparing a voltage at a first node of a first current path with a voltage at a second node of a second current path, the first current path being arranged in parallel with the second current path.

34. The method of claim 32 wherein the detecting of the unbalance within the capacitor comprises comparing an amount of current flowing in a first current path with an amount of current flowing in a second current path, the first current path being arranged in parallel with the second current path.

* * * * *